(12) United States Patent
Kim et al.

(10) Patent No.: US 6,993,075 B2
(45) Date of Patent: Jan. 31, 2006

(54) SYSTEMS AND METHODS FOR REDUCING ERROR PROPAGATION IN A VIDEO DATA STREAM

(75) Inventors: Chang-Su Kim, Seoul (KR); Ioannis Katsavounidis, Pasadena, CA (US)

(73) Assignee: Intervideo, Inc., Fremont, CA (US)

( * ) Notice: Subject to any disclaimer, the term of this patent is extended or adjusted under 35 U.S.C. 154(b) by 593 days.

(21) Appl. No.: 10/092,340

(22) Filed: Mar. 5, 2002

(65) Prior Publication Data
US 2003/0063806 A1    Apr. 3, 2003

Related U.S. Application Data

(60) Provisional application No. 60/286,280, filed on Apr. 25, 2001, provisional application No. 60/275,859, filed on Mar. 14, 2001, provisional application No. 60/273,443, filed on Mar. 5, 2001.

(51) Int. Cl.
*H04N 1/66*    (2006.01)

(52) U.S. Cl. .................................. 375/240.12

(58) Field of Classification Search ........... 375/240.01, 375/240.09, 240.12, 240.16; 382/304; H04B 1/66
See application file for complete search history.

(56) References Cited

U.S. PATENT DOCUMENTS

| | | | |
|---|---|---|---|
| 5,436,664 A | 7/1995 | Henry | |
| 5,461,679 A * | 10/1995 | Normile et al. | 382/304 |
| 5,502,573 A | 3/1996 | Fujinami | |
| 5,912,707 A | 6/1999 | Kim | |
| 5,936,674 A | 8/1999 | Kim | |
| 5,995,171 A | 11/1999 | Enari et al. | |
| 6,118,823 A * | 9/2000 | Carr | 375/240.28 |
| 6,141,448 A | 10/2000 | Khansari et al. | |
| 6,148,026 A | 11/2000 | Puri et al. | |
| 6,438,165 B2 * | 8/2002 | Normile | 375/240 |
| 2002/0085637 A1 * | 7/2002 | Henning | 375/240.14 |

OTHER PUBLICATIONS

U.S. Appl. No. 10/092,366, filed Mar, 5 ,2002, Kim et al.
U.S. Appl. No. 10/092,376, filed Mar. 5, 2002, Katsavounidis et al.
U.S. Appl. No. 10/092,353, filed Mar. 5, 2002, Katsavounidis et al.
U.S. Appl. No. 10/092,384, filed Mar. 5 ,2002, Kim et al.
U.S. Appl. No. 10/092,375, filed Mar. 5, 2002, Kim et al.
U.S. Appl. No. 10/092,345, filed Mar. 5, 2002, Kim et al.
U.S. Appl. No. 10/092,392, filed Mar. 5, 2002, Katsavounidis et al.
U.S. Appl. No. 10/092,383, filed Mar. 3, 2002, Zhao et al.
U.S. Appl. No. 10/092,373, filed Mar. 5, 2002, Kim et al.
U.S. Appl. No. 10/092,339, filed Mar. 5, 2002, Kim et al.

(Continued)

*Primary Examiner*—Tung Vo
(74) *Attorney, Agent, or Firm*—Rosenberg, Klein & Lee

(57) ABSTRACT

The present invention is related to error resilient video encoding. A first instruction to intracode a first frame is received. In response to the first instruction, the first frame is intracoded. In addition, a second sequentially consecutive frame is intracoded as a result of the first instruction to intracode the first frame.

22 Claims, 18 Drawing Sheets

OTHER PUBLICATIONS

U.S. Appl. No. 10/092,394, filed Mar. 5, 2002, Katsavounidis et al.

M. Budagavi and J. D. Gibson, "Error propagation in motion compensated video over wireless channels," in Proc. ICIP'97, vol. 2, Oct. 1997, pp. 89-92.

JinGyeong Kim, JongWon Kim and C.-C. Jay Kuo,"An Integrated AIR/UEP Scheme for Robust Video Transmission with a Corruption Model" Paper presented at ITCOM 2001 (Aug. 2001).

Chang-Su Kim, Ph.D. Thesis, "On the Techniques for Robust Transmission of Video Sequence over Noisy Channel" Graduate School of Seoul National University, Department of Electrical Engineering, Aug. 2000 pp. 1-140.

Seung Hwan Kim, Chang-Su Kim, and Sang-Uk Lee, "Enhanced motion compensation algorithm based on second-order prediction," Proc. ICIP-2000, vol. 2, pp. 875-878, Sep. 2000.

Chang-Su Kim, Rin-Chul Kim, and Sang-Uk Lee, "Robust transmission of video sequence using double-vector motion compensation," IEEE Transactions on Circuits and Systems for Video Technology, vol. 11, No. 9, pp. 1011-1021, Sep. 2001.

Lifeng Zhao, Jitae Shin, JongWon Kim, and C.-C. Jay Kuo, "FGS MPEG-4 video streaming with constant quality rate adaptation, prioritized packetization and differentiated forward," in Proc. SPIE ITCOM 2001: Video Technologies for Multimedia Applications, Denver, CO, Aug. 2001.

Lifeng Zhao, JongWon Kim, and C.-C. Jay Kuo, "MPEG-4 FGS video streaming with constant-quality rate control and differentiated forwarding," in Proc. SPIE Visual Communications and Image Processing 2002, San Jose, CA, Jan. 2002.

* cited by examiner

○ = INTEGER PIXEL LOCATIONS
X = HORIZONTAL HALF-PIXEL MOTION
◆ = VERTICAL HALF-PIXEL MOTION
□ = HALF PIXEL MOTION IN BOTH HORIZONTAL AND VERTICAL DIRECTION

SYSTEMS AND METHODS FOR REDUCING ERROR PROPAGATION IN A VIDEO DATA STREAM

PRIORITY CLAIM

This application claims the benefit under 35 U.S.C. 119(e) of U.S. Provisional Application No. 60/273,443, filed Mar. 5, 2001, U.S. Provisional Application No. 60/275,859, filed Mar. 14, 2001, and U.S. Provisional Application No. 60/286,280, filed Apr. 25, 2001, which are incorporated herein in their entirety.

APPENDIX A

Appendix A, which forms a part of this disclosure, is a list of commonly owned copending U.S. patent applications. Each of the applications listed in Appendix A is hereby incorporated by reference herein in its entirety.

COPYRIGHT RIGHTS

A portion of the disclosure of this patent document contains material that is subject to copyright protection. The copyright owner has no objection to the facsimile reproduction by any one of the patent document or the patent disclosure, as it appears in the Patent and Trademark Office patent file or records, but otherwise reserves all copyright rights whatsoever.

BACKGROUND OF THE INVENTION

1. Field of the Invention

The present invention is related to video and image coding and in particular to systems and methods for coding video image information in a compressed and error resilient manner.

2. Description of the Related Art

MPEG is an ISO/IEC standard developed by MPEG (Moving Picture Experts Group). There are several versions of the MPEG standard, such as MPEG-1, MPEG-2, MPEG-4, and MPEG-7, and they are intended to standardize certain aspects of image and audio compression. As with other forms of video compression, such as H.261, H.262, H.263, H.263+, H.263++, H.26L, MPEG compression attempts to eliminate redundant or irrelevant data. For example, an MPEG encoder uses information from selected frames to reduce the overall video data that needs to be transmitted for certain other frames.

Typically, a video frame can be encoded in one of three ways, as an intraframe, as a predicted frame, and as a bi-directional frame. In addition, a video frame can also be skipped in order to reduce the resulting file size or bit-rate. An intraframe typically contains the complete image data for that frame and so does not rely on image data from other frames. Intraframe encoding provides the least compression. A predicted frame generally contains just enough information to allow a decoder to display the frame based on a recent preceding intraframe or predicted frame. This means that the predicted frame contains the data that relates to how the image has changed from the previous frame and residual error correction data. A bi-directional frame is generated from information from the surrounding intraframe(s) and/or predicted frames, including residual error correction data. Using data from the surrounding frames, the decoder uses interpolation to calculate the position and color of each pixel.

The MPEG-4 standard was developed for use with both low and high bit rate applications. For example, MPEG-4 has been enhanced for use in interactive video games, videoconferencing, videophones, interactive storage media, multimedia mailing, wireless multimedia and broadcasting applications. MPEG-4 provides for object scalability, improved error robustness and enhanced compression.

The ever-increasing demand for multimedia communications via the wired/wireless Internet faces the challenge of packet loss as well as bandwidth fluctuation. The dependency between image frames makes the compressed video stream vulnerable even to a small number of lost packets. MPEG-4 has therefore been particularly enhanced for use in low bit rate (<64 kbs), error prone applications, such as mobile, wireless applications, and error-prone ATM (asynchronous transfer mode) network applications. Mobile operation tends to be more susceptible to transmission errors as there is often less data redundancy, in order to reduce bit rates, and greater sources of "noise." For example, wireless channels can be corrupted by environmental noise, and in the case of mobile applications, by burst noise resulting from multipath fading and shadowing caused by buildings and other structures. With respect to ATM network applications, cells can be lost due to network congestion and buffer overflow.

MPEG-4 has enhanced error resiliency as compared to previous versions of MPEG so that video data can be more successfully transmitted over such error prone networks. For example, one error resiliency technique provided for by the MPEG-4 standard is the use of resync markers in the video bit-stream. In particular, MPEG-4 has adopted fixed interval synchronization and specifies that video object plane (VOP) start codes and resynchronization markers (i.e., the start of a video packet) appear only at legal fixed interval locations in the bitstream. This helps to avoid the problems associated with start codes emulations. Through the use of resync markers included by an encoder in the video data, synchronization lost after an error can be regained by a decoder.

Another error resiliency technique provided for by the MPEG-4 standard is the use of a reversible variable-length code. This code can be decoded even when read backwards, enabling a decoder to use uncorrupted information from a newly found resync marker back to the point in the data where the error occurred. Still another error resiliency technique adopted by MPEG-4 is data partitioning, used to separate motion information from texture information using a second resynchronization marker inserted between motion and texture information. Thus, if there is an error and the texture information is undecodable or lost, the decoder can utilize the motion information to conceal the error by using the motion information to compensate the previous decoded frame or VOP.

However, despite the use of the enhancements described above, many MPEG-4 encoders and decoders fail to provide sufficient error resiliency as is often desired in error-prone applications, such as in cellular phone applications. Thus, the transmission of MPEG-4 compliant video streams over cellular networks often results in unrecoverable corrupted data and the significant degradation in the quality of the video data seen by a recipient. Such video degradation can make video communication over error-prone networks undesirable for a user's perspective, and disadvantageously impedes the adoption and use of video transmissions over error-prone networks.

Further, to meet target bit rates, conventional encoders drop frames to reduce the frame rate according to a simple skipping algorithm. For example, a conventional encoder will drop every 4 of 5 frames in a video clip to convert the video clip from a 30 frames per second rate to a 6 frames per second rate. However, this simple form of skipping often has a significant adverse impact on the visual quality when decoded.

SUMMARY OF THE INVENTION

The present invention is related to video encoding and in particular to systems and methods for encoding video information for transmission in a compressed manner and/or an error resilient manner. Embodiments of the present invention advantageously enable the transmission of video information even in low-bit rate, high noise environments. For example, embodiments of the present invention enable video transmission to be successfully performed over cellular networks and the like.

In one embodiment of the present invention, enhanced error resilience is provided by automatically inserting two consecutive intracoded I-frames upon a scene change. By including two intracoded frames upon a scene change, error propagation is reduced on the decoder-side if one of the two sequential intracoded frames is lost or undecodable.

By way of example, in one embodiment a method of enhancing error resiliency in an encoded video transmission is provided, the method comprising: receiving an indication that a first frame corresponds to a scene change; intracoding the first frame at least partly in response to receiving the indication that the first frame corresponds to a scene change; automatically intracoding the next consecutive frame; and transmitting the intracoded first frame and the intracoded next consecutive frame.

In another embodiment, a video coding apparatus is provided, comprising: a first instruction stored in a processor readable memory, the first instruction configured to receive an indication that a first frame is to be intracoded; a second instruction stored in processor readable memory, the second instruction configured to intracode the first frame at least partly in response to the indication; and a third instruction stored in processor readable memory, the third instruction configured to automatically intracode the frame immediately after the first frame as a result of the indication that the first frame is to be intracoded.

In still another embodiment, a method of encoding video frames is provided, the method comprising: receiving a first instruction to intracode a first frame; intracoding the first frame in response to the first instruction; and intracoding a second frame as a result of the first instruction to intracode the first frame.

In yet another embodiment, an encoding apparatus is provided, comprising: a means for receiving a first indication to intracode a first frame; a means for intracoding the first frame in response to the first instruction; and a means for intracoding a second frame as a result of the first instruction to intracode the first frame.

BRIEF DESCRIPTION OF THE DRAWINGS

Embodiments of the present invention will now be described with reference to the drawings summarized below. These drawings and the associated description are provided to illustrate example embodiments of the invention, and not to limit the scope of the invention.

DETAILED DESCRIPTION OF THE PREFERRED EMBODIMENT

The present invention is related to video encoding and in particular to systems and methods for encoding video information for transmission in a compressed and/or an error resilient manner. Thus, embodiments of the present invention advantageously enable the transmission of video information even in low-bit rate, noise, error-prone environments. Embodiments of the present invention can be used with a variety of video compression standards, such as, by way of example, the MPEG-4 standard, as well as MPEG-1, MPEG-2, H.261, H.262, H.263, H.263+, H.263++, and H.26L, and video standards yet to be developed. Aspects of the MPEG-4 standard are defined in "Coding of Audio-Visual Objects: Systems," 14496-1, ISO/IEC JTC1/SC29/WG11 N2501, November 1998, and "Coding of Audio-Visual Objects: Visual," 14496-2, ISO/IEC JTC1/SC29/WG11 N2502, November 1998, and the MPEG-4 Video Verification Model is defined in "MPEG-4 Video Verification Model 17.0", ISO/IEC JTC1/SC29/WG11 N3515, Beijing, China, July 2000, which are incorporated herein by reference in their entirety.

Figure 1A:
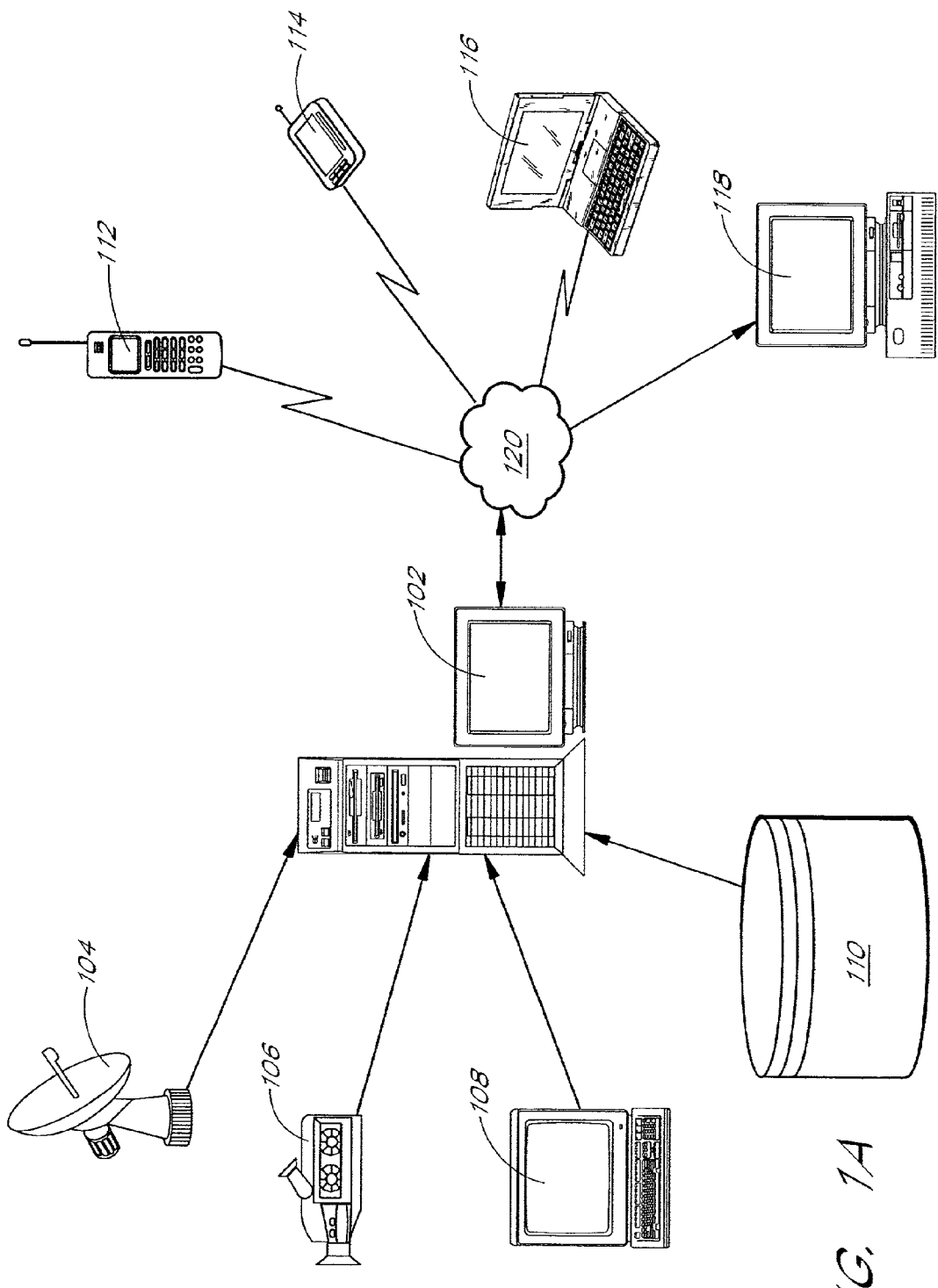
FIG. 1A illustrates an example networked system for implementing a video distribution system.

FIG. 1A illustrates a networked system for implementing a video distribution system in accordance with one embodiment of the invention. An encoding computer 102 receives a video signal, which is to be encoded to a relatively compact and robust format. The encoding computer 102 can correspond to a variety of machine types, including general purpose computers that execute software and to specialized hardware. The encoding computer 102 can receive a video sequence from a wide variety of sources, such as via a satellite receiver 104, a video camera 106, and a video conferencing terminal 108. The video camera 106 can correspond to a variety of camera types, such as video camera recorders, Web cams, cameras built into wireless devices, and the like. Video sequences can also be stored in a data store 110. The data store 110 can be internal to or external to the encoding computer 102. The data store 110 can include devices such as tapes, hard disks, optical disks, and the like. It will be understood by one of ordinary skill in the art that a data store, such as the data store 110 illustrated in FIG. 1A, can store unencoded video, encoded video, or both. In one embodiment, the encoding computer 102 retrieves unencoded video from a data store, such as the data store 110, encodes the unencoded video, and stores the encoded video to a data store, which can be the same data store or another data store. It will be understood that a source for the video can include a source that was originally taken in a film format.

The encoding computer 102 distributes the encoded video to a receiving device, which decodes the encoded video. The receiving device can correspond to a wide variety of devices that can display video. For example, the receiving devices shown in the illustrated networked system include a cell phone 112, a personal digital assistant (PDA) 114, a laptop computer 116, and a desktop computer 118. The receiving devices can communicate with the encoding computer 102 through a communication network 120, which can correspond to a variety of communication networks including a wireless communication network. It will be understood by one of ordinary skill in the art that a receiving device, such as the cell phone 112, can also be used to transmit a video signal to the encoding computer 102.

The encoding computer 102, as well as a receiving device or decoder, can correspond to a wide variety of computers. For example, the encoding computer 102 can be a microprocessor or processor (hereinafter referred to as processor) controlled device, including, but not limited to a terminal device, such as a personal computer, a workstation, a server, a client, a mini computer, a main-frame computer, a laptop computer, a network of individual computers, a mobile computer, a palm top computer, a hand held computer, a set top box for a TV, an interactive television, an interactive kiosk, a personal digital assistant, an interactive wireless communications device, a mobile browser, a Web enabled cell phone, a personal digital assistant (PDA) or a combination thereof. By way of example, an encoder computer may also be included in the camera 106, the cell phone 112, the PDA 114, the laptop computer 116, and/or the desktop computer 118. The computer 102 may further possess input devices such as a keyboard, a mouse, a trackball, a touch pad, or a touch screen and output devices such as a computer screen, printer, speaker, or other input devices now in existence or later developed.

The encoding computer 102, as well as a decoder computer, can correspond to a uniprocessor or multiprocessor machine. Additionally, the encoder and decoder computers can include an addressable storage medium or computer accessible medium, such as random access memory (RAM), an electronically erasable programmable read-only memory (EEPROM), masked read-only memory, one-time programmable memory, hard disks, floppy disks, laser disk players, digital video devices, Compact Disc ROMs, DVD-ROMs, other optical media, video tapes, audio tapes, magnetic recording tracks, electronic networks, and other techniques to transmit or store electronic content such as, by way of example, programs and data. In one embodiment, the encoding and decoding computers are equipped with a network communication device such as a network interface card, a modem, Infra-Red (IR) port, a wireless network interface, or other network connection device suitable for connecting to a network. Furthermore, the computers execute an appropriate operating system, such as Linux, Unix, Microsoft® Windows® 3.1, Microsoft® Windows® 95, Microsoft® Windows® 98, Microsoft® Windows® NT, Microsoft® Windows® 2000, Microsoft® Windows® Me, Microsoft® Windows® XP, Apple® MacOS®, IBM® OS/2®, Microsoft® Windows® CE, or Palm OS®. As is conventional, the appropriate operating system may advantageously include a communications protocol implementation, which handles all incoming and outgoing message traffic passed over the network, which can include a wireless network. In other embodiments, while the operating system may differ depending on the type of computer, the operating system may continue to provide the appropriate communications protocols necessary to establish communication links with the network.

Figure 1B:
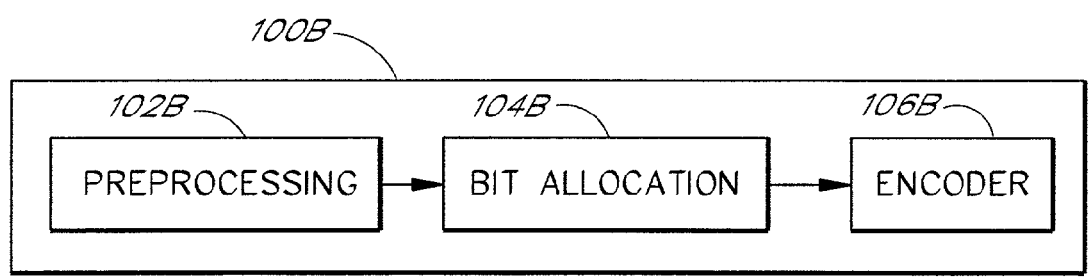
FIGS. 1B–C illustrate an example encoder architecture in accordance with an embodiment of the present invention.

FIG. 1B illustrates an example encoding system 100B in accordance with an embodiment of the present invention. The term encoding system, as used herein, includes one or more encoders. The encoding system 100B comprises, by way of example, one or more of processors, program logic, or other substrate configurations representing data and instructions, which operate as described herein. In other embodiments, the encoding system 100B can comprise controller circuitry, integrated circuits, gate arrays, application specific circuits, processor circuitry, processors, general purpose single-chip or multi-chip microprocessors, digital signal processors, embedded microprocessors, microcontrollers and the like, executing software code, including instructions and data stored in computer readable memory. By way of example and not limitation, the encoding system 100B can be housed in one or more leaded, leadless, or ball grid array semiconductor packages, on one or more circuit boards, and/or using one or more hybrid packages. All or portions of the encoding system 100B may be included in a fixed terminal, such as a desktop computer, or in a portable terminal, such as a cellular phone, portable computer, personal digital assistant, video camera, or the like. The encoding system 100B can, in an example embodiment, correspond to the encoding computer 102. By way of further example, an encoding system in accordance with the present invention can be used to conduct video conferencing, to aid in the storage and transmission of movies or other images, and the like.

The encoding system 100B encodes and compresses video information for transmission to a decoder. The encoding system 100B includes a preprocessing module or circuit 102B, a bit allocation module or circuit 104B, and an encoder module or circuit 106B. The preprocessing module or circuit 102B, including a video sequence analyzer, is used to detect when a scene change has taken place and to determine how a given frame, VOP or picture, is to be encoded.

A video object layer contains a sequence of 2D representations of arbitrary shape at different time intervals that is referred to in MPEG-4 as a video object plane (VOP). Each of the VOP regions can be non-rectangular and may correspond to particular image or video content of interest, such as physical objects within a scene. Video object planes (VOPs) are divided into macroblocks of size 16×16. A macroblock is encoded in six blocks, four for luminosity and two for chromaticity, of size 8×8. To obtain a macroblock structure from an arbitrary shaped VOP, the bounding box of the VOP is calculated and extended to multiples of the macroblock size.

However, for most current applications, and in particular for wireless applications using the so-called "simple profile," there is generally only 1 VOP per frame, which is a rectangular VOP. For clarity, the term frame, as used herein, can also include a VOP, such as an MPEG-4 VOP, or a picture. Similarly, the term VOP, as used herein, can also refer to a frame. In MPEG-4, the VOPs can be structured in groups of video object planes (GOV). Using MPEG-2 terminology, frames or pictures can be arranged in groups of pictures (GOPs). For clarity, the term "scene" as used herein, may also refer to a GOV or a GOP and visa versa.

A frame or video object may be encoded as an intracoded frame (an "I-frame" or "I-VOP"), as a predicted frame (a "P-frame" or "P-VOP"), or as a bi-directional frame (a "B-frame" or "B-VOP"). MPEG-1 also provides for a D-frame. A D-frame is a frame that has no motion vectors, so that a zero vector is assumed, and has texture DCT data. To exploit spatial redundancy, a Discrete Cosine Transformation (DCT) is performed on the encoded frames and the resulting coefficients are quantized.

The MPEG-4 simple profile does not support B-frames or B-VOPs. However, the simple profile does support frame skipping. A video frame can be skipped in order to reduce the resulting file size or bit-rate. Because the MPEG-4 simple profile does not support B-frames or D-frames, the following discussions will not focus on such frames. Nonetheless, embodiments of the present invention can be used with B-frames and D-frames in accordance with other profiles and other standards.

The term frame can correspond to either an interlaced frame or to a non-interlaced frame, i.e., a progressive frame. In an interlaced frame, each frame is made of two separate fields, which are interlaced together to create the frame. Such interlacing is not performed in a non-interlaced or progressive frame. While illustrated in the context of non-interlaced or progressive video, one or ordinary skill in the field will appreciate that the principles and advantages described herein are applicable to both interlaced video and non-interlaced video. In addition, while embodiments of the invention are described in the context of MPEG-4, aspects of the principles and advantages described herein are also applicable to other video standards, including, by way of example, MPEG-1, MPEG-2, H.261, H.262, H.263, H.263+, H.263++, and H.26L, as well as video standards yet to be developed.

An intracoded I-frame typically only includes information from the image itself and thus an I-frame can be decoded independently of other frames. P and B frames are also referred to as intercoded frames because they are encoded based on data from other frames. The preprocessing module 102 generates a file, referred to as an input frame-type file, containing the frame-type designations corresponding to the frames. In other embodiments, the frame-type information is passed to other portions of the encoding system 100B using variables and the like. While the preprocessing module 102B is illustrated in FIG. 1B as being included in the encoding system 100B, the preprocessing module 102B can be physically separate from the other portions of the encoding system 100B. In such an embodiment, the preprocessing module 102B can produce a text file that includes frame-type designation that is then input by the remainder of the encoding system 100B.

Many standard MPEG-4 encoders can only handle one scene, that is, one I-frame followed by P-frames or B-frames, or they introduce regular I-frames every k frames, as is commonly done in MPEG-2 encoding. These approaches make implementation of the encoder simpler, however they place the burden on the user to determine how clips of multiple scenes are to be handled. To adequately improve the coding efficiency, the number of I-frames should be reduced or minimized. In the absence of error conditions, I-frames are preferably used in scene-changes only. Thus, it is advantageous to correctly and accurately detect scene changes.

An example scene change detection process in accordance with an embodiment of the present invention will now be described. In the example embodiment, the process operates on YUV-4:2:0 files and produces a text file as an output. In the example embodiment, YUV-4:2:0 files are header-less files with concatenated frames, where, for each frame, the (luminosity) Y-pixel values are provided first, followed by the (Chromaticity-blue) Cb-values, and then the (Chromaticity-red) Cr-values. The term "4:2:0" indicates that chromaticity values are subsampled by a factor 4 with respect to luminosity. In particular, if the size of a frame (in pixels) is W×H (W: width, H: height), there are W*H Y-values (1 for each frame pixel), (W/2)*(H/2) Cb-values and (W/2)*(H/2) Cr-values for each frame. That gives a total of 3*W*H/2 bytes as the frame buffer size needed to store a frame of size W×H. The subsampling for chromaticity components is achieved by subsampling along the vertical and horizontal dimensions by a factor of 2. Thus, a 2×2 block has 4 luminosity values, and 1 chromaticity-blue and 1 chromaticity-red. In other embodiments, other formats for storing image data can be used.

The preprocessing module 102B will now be described in greater detail. The preprocessing module 102B performs frame evaluation and encoding designation. As will be described below, each frame is designated by the preprocessing module 102B as an I-frame, a P-frame, or as a skipped frame. In other embodiments, the preprocessing module 102B may also designate frames as B-frames or D-frames. B-frame encoding may be performed if there is sufficient computational power, available bandwidth (B-frames take much more bandwidth than skipped frames), and if allowed by the corresponding standard. For example, the MPEG-4 simple-profile syntax, used in wireless networks, does not allow for B-frames. The example file format generated by the preprocessing module 102B includes a line per input frame, with a frame-type designation character on each line: 0, 1 or 2. A "0" indicates an I-frame, a "1" indicates a P-frame, and a "2" indicates a skipped frame. In other embodiments, designations can be provided for a bidirectional frame and a D-frame.

As previously discussed, scene change frames are generally intracoded. To locate the scene change frames, the preprocessing module's scene change analysis performs a color-weighted Root Mean Squared (RMS) calculation and a Mean Absolute Differences (MAD) calculation between the $i^{th}$ frame $F_i$ and the $k^{th}$ frame $F_k$. The RMS can be defined as:

$$RMS(F_i, F_k) = \frac{\alpha}{\alpha+\beta+\gamma}\sqrt{\frac{1}{w \times h}\sum_{x=1}^{w}\sum_{y=1}^{h}|Y_i(x,y)-Y_k(x,y)|^2} +$$

$$\frac{2\beta}{\alpha+\beta+\gamma}\sqrt{\frac{1}{w \times h}\sum_{x=1}^{w/2}\sum_{y=1}^{h/2}|U_i(x,y)-U_k(x,y)|^2} +$$

$$\frac{2\gamma}{\alpha+\beta+\gamma}\sqrt{\frac{1}{w \times h}\sum_{x=1}^{w/2}\sum_{y=1}^{h/2}|V_i(x,y)-V_k(x,y)|^2}$$

Equation 1 where F(x, y) denotes the $(x, y)^{th}$ pixel in frame F, and w and h are the width and height of the frame, respectively. Y(x, y) indicates the luminance value, while U(x, y) and V(x, y) are the two chromaticity components. The coefficients, and are weighting coefficients for the luminosity, chromaticity-blue and chromaticity-red components correspondingly. To ease computations, the weighting coefficients can be fixed. For example, the weighting coefficients can be set as follows:===1.

The Mean Absolute Difference (MAD) measure can be defined as follows:

$$MAD(F_i, F_k) = \frac{1}{w \times h} \sum_{x=1}^{w} \sum_{y=1}^{h} |Y_i(x, y) - Y_k(x, y)| \quad \text{Equation 2}$$

In this example, the MAD does not need to include the two chromaticity components.

If $MAD(F_i,F_k)$ and/or $RMS(F_i,F_k)$ are large or greater than a selected criteria, this indicates that the content of $F_i$ is substantially different from $F_k$. Thus in one embodiment, if the MAD between consecutive frames, $MAD(F_{i-1}, F_i)$, is larger than a pre-specified threshold, $F_i$ is designated a scene change frame. An example threshold value for designating a scene change frame is approximately 25.

Optionally, a second temporal derivative of the RMS can be used to determine if a frame is scene change frame, as follows:

$$\frac{d^2(RMS)}{dt^2}(i) = \quad \text{Equation 3}$$
$$RMS(F_{i-1}, F_i) - 2RMS(F_i, F_{i+1}) + RMS(F_{i+1}, F_{i+2})$$

As defined by Equation 3, the second temporal derivative of the RMS is based on the RMS value for the previous frame $F_{i-1}$ relative to the current frame $F_i$, the RMS value of the current frame $F_i$ relative to the next frame $F_{i+1}$, and the RMS value of the next frame $F_{i+1}$ to the subsequent frame $F_{i+2}$.

Figure 3:
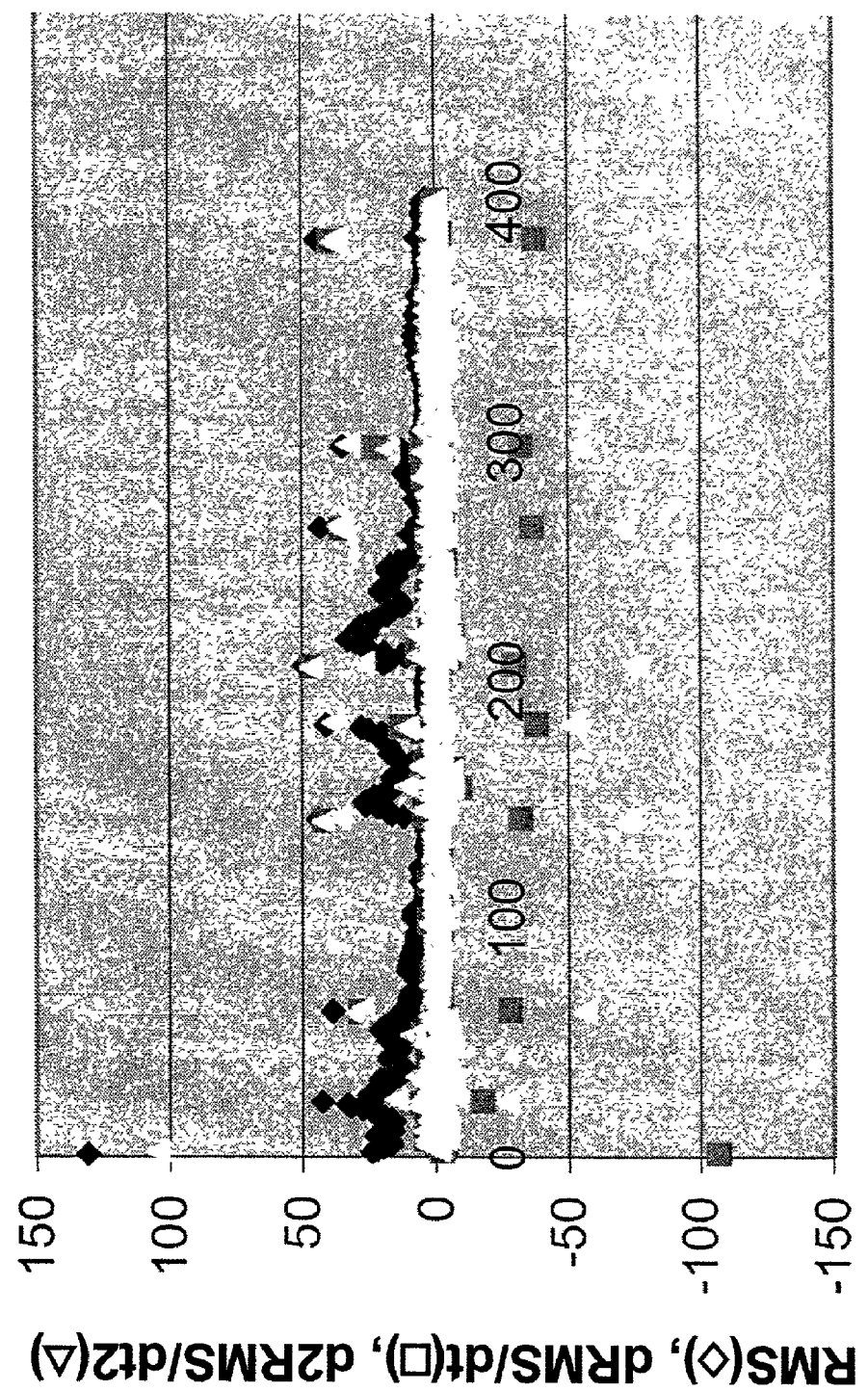
FIG. 3 illustrates an example analysis of a video sequence used to locate a scene change.

The second temporal derivative of the RMS value will be negative with relatively high amplitude when $F_i$ is a scene-change frame, as illustrated in FIG. 3. Thus, if the absolute value of the second temporal derivative of the RMS value is larger than a pre-specified threshold, $F_i$ is designated a scene change frame. As illustrated in FIG. 3, there is a correlation between the RMS values, indicated by the diamonds, and the second derivative of RMS, indicated by the triangles. Thus, both the RMS values the values of the second derivative of RMS generally provide a correct indication of a scene change. An example second derivative of RMS threshold value for determining a scene change is −6.5.

While the second derivative of the RMS is a good peak detector, it is somewhat sensitive to noise. To better increase the accuracy of the scene change determination, in one embodiment only if both the temporal activity measures of MAD and the second-order derivative of RMS indicate that the corresponding thresholds are met or passed, then a frame is designated a scene change frame. As will be described below, scene changes frames will be intracoded as I-frames or I-VOPs.

In particular, in one example a frame is designated as a scene change, and thus will be coded in INTRA mode, when its MAD is greater than 20 and the second derivative of RMS is negative and has an absolute value of greater than 4. In another example, a frame is designated as a scene change, and thus will be coded in INTRA mode, when its RMS is greater than 40 and/or when the second derivative of RMS is negative and has an absolute value of greater than 8. In other embodiments other thresholds can be used. Alternatively or in addition, a second derivative of MAD can be used, as similarly described above with respect to the second derivative of RMS, as a further indication of whether a frame corresponds to a scene change or not.

An additional criterion can be used to determine when a scene change has occurred. For example, in one embodiment, a determination is made as to whether the MAD value is a local maximum, that is, has increased from a previous frame to the frame at issue, and then decreased from the frame at issue to the next frame. If so, this indicates that it is likely the frame at issue is a scene change frame and should be intracoded. In addition, a similar determination may be made for the RMS value. For example, a determination is made as to whether the RMS value is a local maximum, that is, has increased from a previous frame to the frame at issue, and then decreased from the frame at issue to the next frame. If so, this too indicates that it is likely the frame at issue is a scene change frame and should be intracoded.

Optionally, a voting process can be used, wherein if at least two of the RMS, the second derivative of the RMS, and the MAD, meet corresponding criteria, then a frame is designated as a scene change that is to be intracoded. In another embodiment, if the RMS and second derivative of the RMS meet the corresponding criteria, and if the MAD is a local maximum, then the frame is designated as a scene change frame. In still another embodiment, if the RMS and MAD meet the corresponding criteria, and if the MAD is a local maximum, then the frame is designated as a scene change frame.

To further improve coding efficiency and to meet target bit rates, the number of frames that needs to be encoded per second is preferably reduced as much as acceptable. One technique used to reduce the number of frames encoded per second is to skip-frames in the encoding process. Two example frame-skipping techniques are fixed frame skipping and adaptive frame skipping. Conventional encoders drop frames to reduce the frame rate according to a simple skipping algorithm. For example, a conventional encoder will drop every 4 of 5 frames in a video clip to convert the video clip from a 30 frames per second rate to a 6 frames per second rate.

As will be discussed below, fixed frame skipping tends to provide better error resiliency in noisy environments, while adaptive frame skipping tends to provide better visual results in low noise environments. Optionally, the preprocessing module 102B calculates, based on the bit-rate/frame-rate formula defined in Equation 7 below, the target encoding frame-rate and then switches between adaptive and fixed skipping in order to meet a target encoding frame rate.

In fixed frame skipping, the input video frame sequence is subsampled along the time axis, by keeping 1 in every k frames, where k is the subsampling factor. For example, if:

k=5 and the original video sequence has a frame rate=25 frames-per-second (fps); then the subsampled sequence has a frame rate=5 fps.

In adaptive frame skipping, as in fixed frame skipping, the input video frame sequence is subsampled along the time axis in order to achieve a desired or predetermined average frame rate. However, rather than skip-frames in a fixed manner, using adaptive frame skipping the rate of frame skipping can be irregular and can vary along the sequence length. Preferably, low activity frames are identified and skipped, and scene-change frames are kept and intracoded. Non-scene changes having some activity frame are intercoded. Because the skipped frames are intelligently selected based on changes on visual activity, the visual result when reproduced by the decoder will be better than with fixed frame skipping, assuming no or relatively few errors occur.

In one embodiment, the preprocessing module 102B codes skipped frames using a "not_coded" bit-flag or indicator set in the video object plane (VOP) header in an MPEG bit stream. An MPEG-4 video packet starts with the VOP header or the video packet header, followed by motion_shape_texture( ), and ends with next_resync_marker( ) or next_start_code). Thus, a VOP specifies particular image sequence content and is coded into a separate video object layer by coding contour, motion and texture information.

In another embodiment, a skipped frame is skipped altogether, without inserting VOP-header information in the bitstream. A skipped frame may be recreated by a decoder using interpolation or by repeating a previous frame. The decoder may perform interpolation by pixel averaging between a preceding frame and a subsequent decoded frame, weighted by their time difference.

The information regarding the video sequence frame rate is normally carried in the Video-Object-Layer (VOL) header. In particular, a parameter, referred to as vop_time_increment_resolution, determines the number of time units for each encoding cycle. The vop_time_increment value in the Video-Object-Plane (VOP) header carries the time stamp for each frame.

The vop_time_increment_resolution may be, by way of example, a 16 bit unsigned integer value. For example, for 25 frames per second (fps), vop_time_increment_resolution=25, and vop_time_increment cycles through the values 0 . . . 24. For 7.5 fps, vop_time_increment_resolution=75, and vop_time_increment cycles through the values 0, 10, 20, 30, 40, 50, 60, 70, 5, 15, 25, 35, 45, 55, 65. Thus, successful decoding of the first 2 frames of a sequence can yield the exact frame rate. But, given the error-prone environment of wireless communication or other error-prone environments, the successful reception and decoding of any 2 consecutive frames cannot be guaranteed. Thus, the decoder may incorrectly determine the frame rate of the entire sequence. For that reason, in one embodiment, the "fixed_vop_rate" flag is set by the encoder module 106B in the VOL header, which then provides (via the value of fixed vop_time_increment) the default frame rate. This technique better ensures the successful decoding or determination of the frame rate upon the successful decoding of the VOL header. The fixed_vop_time_increment value can later be stored in a global variable of the decoder, which will use the value to determine whether certain frames need to be interpolated or not. The frames to be interpolated can either be frames skipped by the encoder, or lost during transmission. Thus, the error-resilience performance of the MPEG-4 decoder will be enhanced because it will decode the correct number of frames, thereby avoiding loss-of-sync problems with the audio stream.

As discussed above, for error-prone environments, error resiliency can be enhanced by utilizing fixed frame skipping rather then adaptive frame skipping. Fixed frame skipping enables the decoder to better determine when a frame has been dropped or skipped. Another approach to enhancing error resiliency is to use adaptive frame skipping, but provide a VOP-header with the not_coded flag set for a skipped frame. One drawback of this approach is that it results in a slight increase in bit rate due to the more frequent VOP-headers.

Figure 4A:
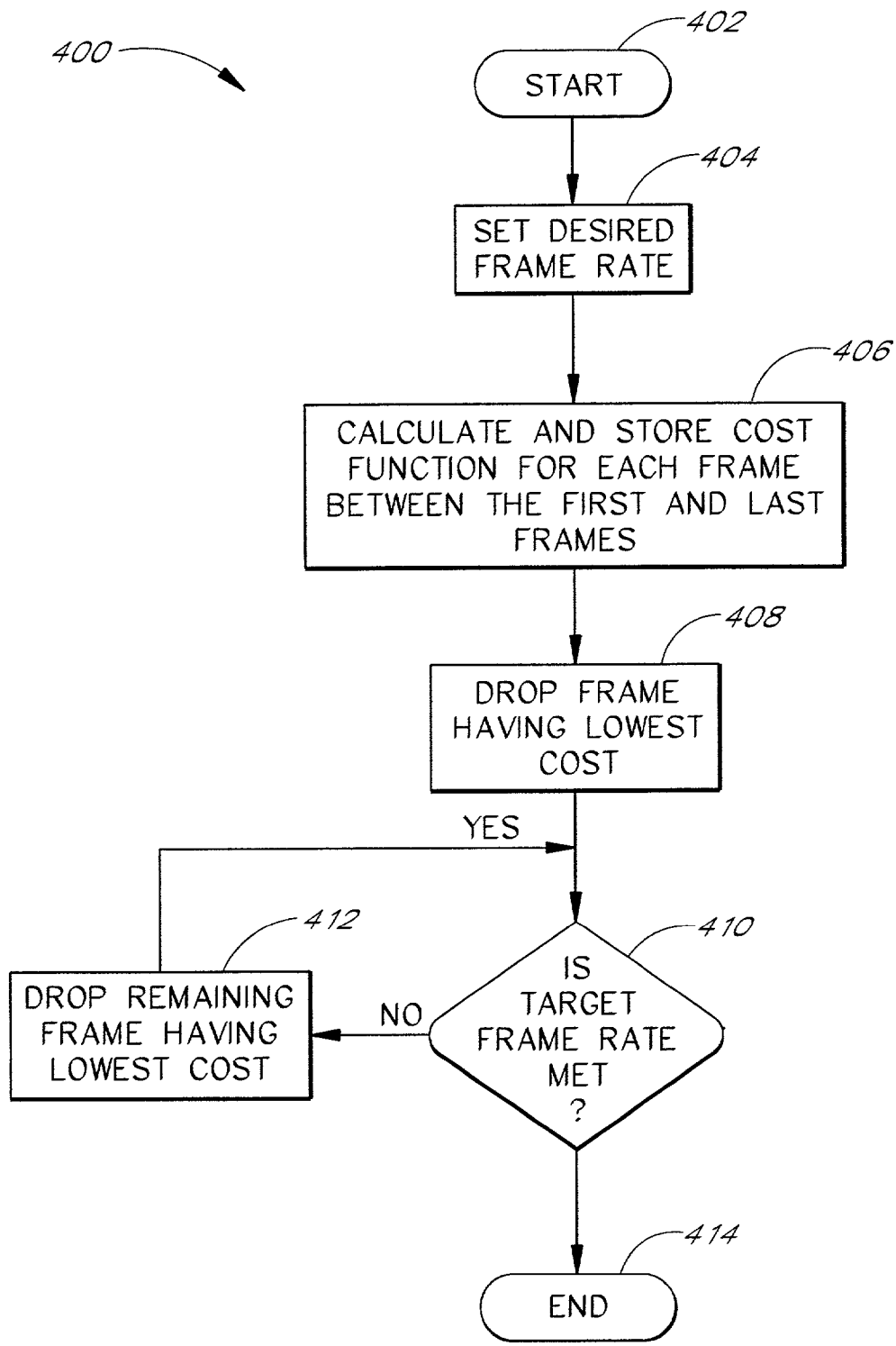
FIGS. 4A–4B illustrate an example of adaptive frame skipping in accordance with an embodiment of the present invention.

FIG. 4A illustrates one example process 400 of adaptive frame skipping. The process is iterative in that a frame is selectively dropped from the sequence of frames by computing a mean of absolute differences between the frames adjacent to the frame of interest, and by weighting the computation with a temporal parameter, wherein the frame having the least impact on the scene is dropped. This procedure is repeatedly iterated until a target frame rate, which is related to the desired bit rate and frame size, is achieved.

Beginning at start state 402, the process 400 proceeds to state 404. The desired frame rate is set or specified. The desired frame rate may be user specified or may be dynamically determined. Proceeding to state 406, the cost function, or adverse impact, that would result from dropping a particular frame is calculated for each frame between the first and last frame in a scene. As described in greater detail below, the cost function can be based at least in part on the mean absolute differences (MAD) between frames closely or most closely bracketing or bounding the particular frame of interest, or on the sum of the mean absolute differences (SMAD). Alternatively or in addition, the cost function can be based on sums of RMS (SRMS) for frames bracketing the particular frame of interest.

Proceeding to state 408, the frame associated with the lowest cost, that is, having the least adverse impact on visual quality, is skipped or dropped. At state 410 a determination is made as to whether the remaining frames will allow the target frame rate to be met. If the target frame rate can now be met, the adaptive frame rate skipping process 400 proceeds to the end state 414. Otherwise, the process 400 proceeds to state 412, and a remaining frame having the lowest cost will be dropped. The cost of all the frames remaining between the first and last frames may be recalculated at state 412 based on the frames that are currently remaining, and the frame with the lowest cost will be dropped. The process 400 repeats states 410 and 412 until the target frame rate has been met, or the number of already consecutively skipped frames is at a specified maximum. While the process 400 is described with respect to selecting which frames to skip, the process 400 can be similarly used to decide what frames should be bi-directionally encoded.

One example embodiment of an adaptive frame skipping selection process using the weighted sum of mean absolute differences will now be described in greater detail. Given an input sequence of a frame rate $r_{orig}$ and the desired frame rate $r_{des}$ (where $r_{orig} > r_{des}$), the video sequence analyzer skips frames in a "greedy" way, that is, until $r_{des}$ is met. The weighted sum of MAD and the time difference between two frames are used in specifying a cost function for identifying the next frame to be skipped. The frame whose cost function meets predetermined criteria or is minimum among remaining candidates for skipping is skipped.

Figure 4B:
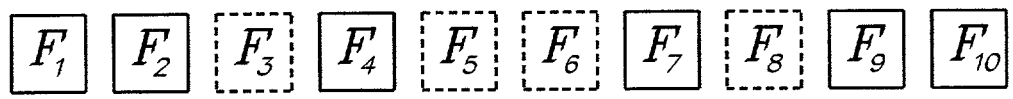

By way of example, referring to FIG. 4B, if using the greedy approach $F_3$, $F_5$, $F_6$, and $F_8$ have already been skipped, $F_4$ is now considered as a candidate for the next skipped frame. In order to determine if $F_4$ is to be skipped, a cost function is calculated assuming that $F_4$ has been skipped. Upon skipping $F_4$, $F_2$ and $F_7$ will be the left and right frames bounding the skipped segment of $F_3$–$F_6$. The cost function is then defined as:

$$\text{Cost} = MAD(F_2, F_7) + \lambda \frac{29.97}{r_{orig}} TD \qquad \text{Equation 5}$$

Where the term $$\frac{29.97}{r_{orig}}$$

is used to normalize the original frame rate $r_{orig}$ with respect to the NTSC frame rate of 29.97 frames/second and where TD denotes the time difference measure. Of course other or different normalizations may be used as well.

Thus, in this example TD is 5 (=7−2), and λ is a weighting coefficient. In this example, the weighting coefficient value=5.0, determined experimentally, provides a suitable result. Alternatively, the weighting coefficient value may be dynamically determined. At the current state, the frame whose cost function is minimum among the candidates is skipped. This process is iteratively performed until the desired frame rate is met. The time difference measure TD can be modified such that no more than n consecutive frames are skipped. For example, if a predetermined maximum number of consecutive frames that can be skipped simultaneously is set to 4, TD can be modified as follows $$TD' = \begin{cases} TD & \text{if } TD \le 5 \\ \infty & \text{otherwise} \end{cases}$$

where ∞ is infinity

Optionally, the complexity for the MAD calculation can be reduced, though the accuracy will be reduced, if only even (or only odd) coordinate pixels are used in the calculation. For example:

$$MAD(F_i, F_k) = \frac{1}{w/2 \times h/2} \sum_{x=1}^{w/2} \sum_{y=1}^{h/2} |Y_i(2x, 2y) - Y_k(2x, 2y)| \quad \text{Equation 6a}$$

Another example process to adaptively determine which frame to skip estimates the total induced distortion, both spatial and temporal, for each candidate frame for skipping, and then skips the frame whose absence would result in the least distortion. As described below, the process utilizes sums of MAD (SMAD) or sums of RMS (SRMS). Advantageously, all the MADs do not have to be recalculated. Instead, the already calculated appropriate MADs are summed differently, depending on which frame is being considered for skipping.

In one embodiment, the process is performed as follows. Assume that $F_i$ is the frame currently being considered for skipping. For example, assume $F_i$ is frame $F_4$ in FIG. 4B. Then let $F_j$ indicate the previous non-skipped frame, $F_2$ in this example, and let frame $F_k$ indicate the next non-skipped frame, $F_7$ in our example. Then the cost function can be defined as follows:

$$\text{Cost} = \quad \text{Equation 6b}$$
$$|SMAD_{est}(F_j, F_k) - SMAD_{est}(F_j, F_i) - SMAD_{est}(F_i, F_k)| + \lambda \frac{29.97}{r_{orig}} TD$$

where $SMAD_{est}(F_i, F_k)$ is the estimated spatial distortion when skipping frames (i+1), ... (k−1).

As can be seen from Equation 6b, the cost function subtracts out the contribution from previously skipped frames. The distortion is calculated as follows:

$$SMAD_{est}(F_i, F_k) = \quad \text{Equation 6c}$$
$$\varphi(k-i-1) \cdot \frac{k-i-1}{k-i} \sum_{j=i+1}^{k} MAD(F_{j-1}, F_j)$$

where φ(n) is a coefficient that depends on the number (n) of consecutive skipped frames and takes into account how much, on the average or based on a statistical sampling, interpolated frames at the decoder are different from the original frames. The following table provides example coefficient values determined experimentally using typical video sequences:

| Adaptive Frame Skipping Coefficient Table | | | | | | | |
|---|---|---|---|---|---|---|---|
| n | 0 | 1 | 2 | 3 | 4 | 5 | 6 | >= 7 |
| φ(n) | 0.0 | 0.746 | 0.886 | 1.010 | 1.198 | 1.276 | 1.348 | 1.500 |

As can be seen, φ(n) increases as the number of skipped frames increases.

To reduce the computational complexity and resources needed, optionally only the MAD between consecutive frames (j−1 and j) is used to estimate the distortion of a complete segment of skipped frames, as in Equation 6b above. The additional distortion when skipping a certain frame is calculated and the temporal component is added.

In one embodiment, a user specifies the desired encoding frame rate. The desired frame rate can be based on the video sequence statistics, such as temporal and spatial complexity, frame size, frame rate and target bit rate or compression ratio. In another embodiment, a heuristic can be used to select the desired frame rate. The following is an example heuristic equation for calculating the frame rate, normalized with respect to the Quarter Common Intermediate Format (QCIF) frame size, containing 144 lines and 176 pixels per line:

$$\text{Encoding frame rate} = \frac{\text{target bit rate in kbps}}{8\sqrt{\frac{176 * 144}{w * h}}} \quad \text{Equation 7}$$

where w and h are the frame dimensions. In order for the encoding frame rate to remain within reasonable bounds, the encoding frame rate should preferably be in the range of:

[1 up to, and including, the source frame rate]

In addition, in order to make adaptive frame skipping independent of the temporal complexity of a specific scene, the weighting coefficient is optionally set equal to the average RMS or MAD of the designated entire sequence.

Thus, to determine which frames are scene change frames, and to adaptively select which frames are to be skipped, the video sequence analyzer is provided with the video sequence, the frame width, frame height, the source frame rate, the target bit rate, and the setting of the error resilience flag in the following format:

<input file><width><height><source frame rate><target bit rate><error resilience flag>

The error resilience flag is set by the user to switch between adaptive frame skipping, which has less error resiliency but a better visual result when there are no or few errors, and fixed frame skipping, which provides better error resiliency with a lesser visual result.

Figure 1C:
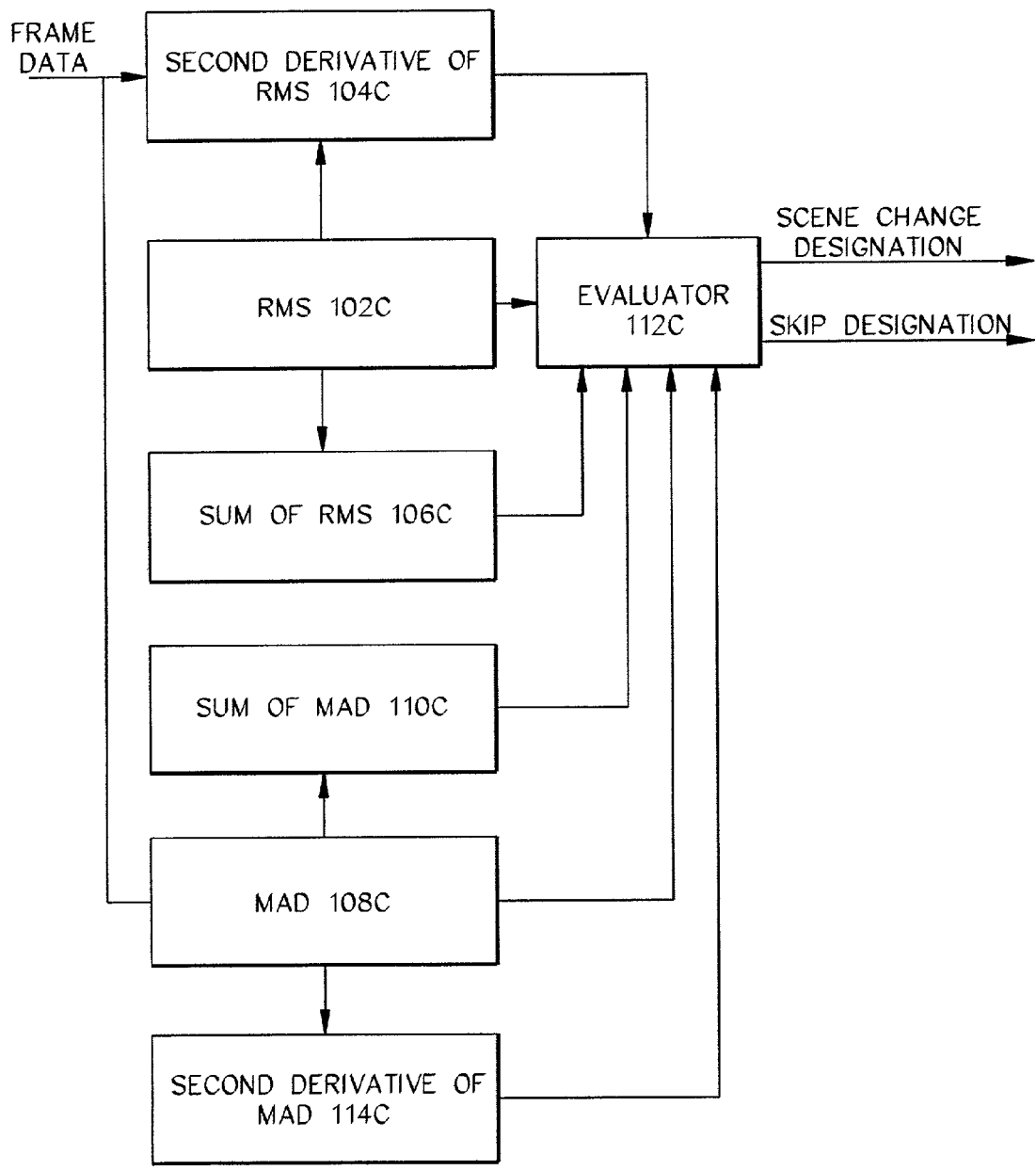

In one embodiment, as illustrated in FIG. 1C, an RMS circuit 102C is used to calculate RMS values as described above, a Second Derivative of RMS circuit 104C is used to calculate the second derivative of RMS as described above, a MAD circuit 108C is used to calculate the MAD values as described above, a SUM OF MAD circuit 110C. is used to calculate the SUM of MAD values as described above, and a Second Derivative of MAD circuit 114C is used to calculated the Second Derivative of MAD as described above. An Evaluator circuit 112C coupled to the outputs of the RMS circuit 102C, the Second Derivative of RMS circuit 104C, the MAD circuit 108C, and the SUM OF MAD circuit 110C, and the Second Derivative of MAD circuit 114C, is used to determine when a scene change has occurred and what frames to skip, based on one or more of the outputs, as discussed above. Of course different embodiments need not include all or any portion of the circuits illustrated in FIG. 1C.

The bit allocation module or circuit 104B will now be described. The bit allocation module or circuit 104B provides for bit allocation on a scene, frame, and/or macroblock level. The bit allocation module 104B reads the file or otherwise receives the information generated by the preprocessing module 102B, including the frame-type designations, and calculates a bit budget for each scene, GOV or GOP based on the coded frames. The bit allocation module determines an appropriate distribution of a fixed bit budget.

As will be described below with respect to an example implementation, a first intracoded frame defines a beginning of a scene. A weight is assigned to the scene based on the number of intracoded frames and the number of interceded frames, where intracoded frames are weighted more heavily then interceded frames to account for the greater number of bits needed to encode an intraframe. The bit allocation module distributes the fixed bit budget within a scene by comparing the current bit usage and target bit usage, and based on the comparison, adjusts a quantization parameter or step size for the current frame.

In particular, the bit-allocation module 104B first parses the input frame-type file from the preprocessing module 102B. The number or quantity of GOVs is then calculated. Based on the calculated bit budget, the encoder module 106B then encodes each GOV using the novel rate control process in accordance with an encoder parameter file, discussed below.

For a given GOV or scene, the number of coded frames and the first and end frame are known. Using the following definitions, the bit budget for a GOV or scene is calculated using Equation 8 below:

$N_{ci}$=number of coded P-VOPs (predicted, interceded VOPs) in scene$_i$ or GOVi.

$B_i$=bit budget for scene i.

B=bit budget for a clip including one or more scenes $N_c$=number of coded frames for the clip $N_s$=number of scenes in clip. Usually, in the absence of the inclusion of consecutive I-frames for error resilience purposes, $N_s$=the number of I-VOPs (intracoded VOPs)

$T_c$=equivalent total number of VOPs in clip

An example method of determining the bit-budget for a scene or GOV is as follows. $B_i$ bits are allocated for each GOV (i). In this example allocation, an assumption is made that the bit usage for one I-frame or I-VOP is close to or equal to the bit-usage of ten P-frames or P-VOPs (Ratio_Of_I_to_P=10). However, the method is not limited to using the 1:10 ratio. $B_i$ and $T_c$ are then determined as follows:

$$B_i = B^*(N_{ci} + \text{Ratio\_Of\_I\_to\_P})/T_c \qquad \text{Equation 8}$$

and $$T_c = N_c + (\text{Ratio\_Of\_I\_to\_P} - 1)^* N_s \qquad \text{Equation 9}$$

As defined by Equation 8, the bit allocation for a given scene is based on the total number of frames in the scene, wherein an intracoded frame is normalized to be the equivalent of several predicted frames. In order to reduce the complexity and computational overhead, this example bit allocation formula does not take into account the spatial and temporal complexity of each GOV or GOP. In other embodiments, if sufficient computational and time resources are available, the bit allocation formula takes the temporal and spatial complexity into consideration to provide a still more intelligent bit allocation for each GOV.

For example, in one embodiment a two-pass encoding process is used that takes into account spatial and temporal complexity. The first pass detects scene changes and collects frame complexity. The second pass performs the actual encoding using complexity guided bit allocation.

The first pass process will now be described in greater detail. A new GOV or GOP is started from a scene change instance. The two-pass rate control process provides substantially uniform quality for each temporally segmented GOV so that quality variation is better limited to GOV or GOP boundaries. This approach is taken because minimizing quality variation, as measured by the Peak Signal to Noise Ratio (PSNR), the Root Mean Square Error or other image fidelity metric, among different scenes provides less benefit with respect to human visual perception.

In characterizing the relative frame complexity, the complexity measure in accordance with one embodiment of the present invention is relatively invariant with the quantization parameter (QP) used. In particular, generally the bit count for non-texture information, such as frame headers/syntax and motion vectors, denoted by $H_i$, is constant or almost constant in terms of quantization parameter (QP) change. This is in contrast to the bit count of the texture information, which does vary with a change in QP. By way of example, based on the MPEG-4 VM R-Q model [MPEG4VM], if the total number of bits used for coding the current frame i is $R_i$, then the texture bits $T_i = R_i - H_i$ can be represented as:

$$\frac{R_i - H_i}{M_i} = \frac{a_1}{Q_i} + \frac{a_2}{Q_i^2} \qquad \text{Equation 10}$$

where $M_i$ is the MAD computed with a motion-compensated residual that is substantially invariant with respect to the QP (i.e., $Q_i$), and $a_1$ and $a_2$ are Taylor expansion coefficients of texture bits $T_i$ over QP. The coefficients $a_1$ and $a_2$ are normally of the same order, that is, have similar values. As can be seen, the lower the QP, the greater then number of texture bits needed to encode a given frame.

The complexity measure $C_{g,i}$ addresses both the motion and texture bit count, and is substantially QP invariant. In one embodiment, $C_{g,i}$ is defined by the ratio of the texture bit count for a given frame to the average texture bit count, and the ratio of the motion vector bit count for the given frame to the average motion vector bit count, as follows:

$$C_{g,i}=(R_{g,i}-H_{g,i})/\overline{R_g-H_g}+MV_{(g,i)}/\overline{MV_g} \qquad \text{Equation 11}$$

where the $MV_{(g,i)}$ is the motion vector bit count for frame (g,i), $\overline{MV_g}$ is the average motion vector bit count, and $\overline{R_g-H_g}$ is the average texture bit count. Because the obtained complexity measure $C_{g,i}$ is substantially QP invariant, the frame complexity can be generated in one pass, that is, with one QP. The calculated frame complexity will be utilized in the second encoding pass as will now be described.

Figure 9:
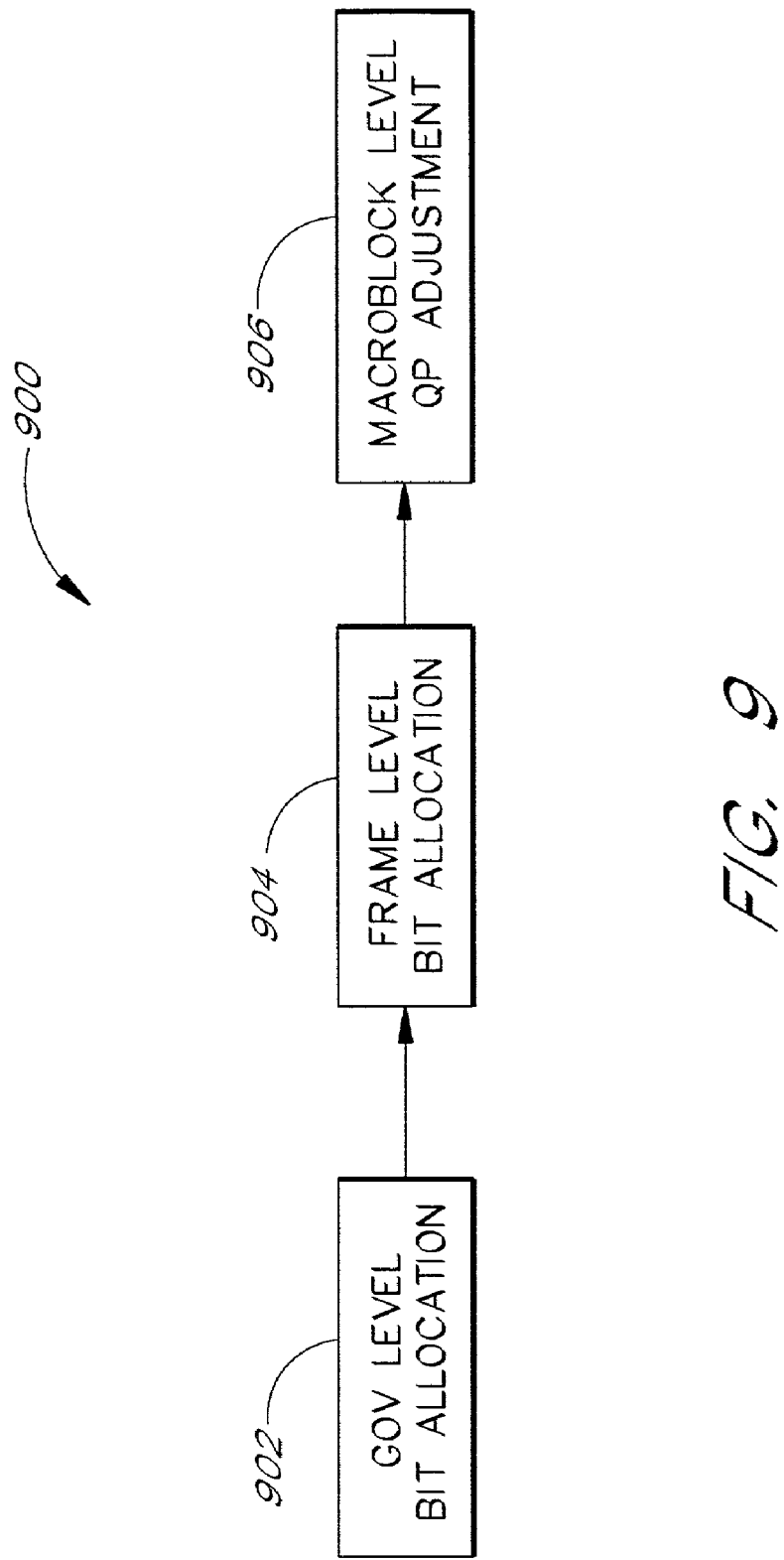
FIG. 9 illustrates an example rate control process in accordance with an embodiment of the present invention.

As illustrated in FIG. 9, the rate control process 900 in the second pass consists of a three level hierarchy, scene (GOV or GOP)-level bit allocation 902, frame-level bit allocation 904, and macroblock-level QP adjustment 906 which utilizes the obtained frame complexity values $C_{g,i}$.

Complexity-guided scene, GOV, or GOP, level bit allocation will now be described with reference to FIG. 10. To assign bits to each scene, the complexity measure is defined for each GOV or GOP by calculating the average spatial complexity $\overline{C}^{(g)}$ as follows:

$$\overline{C}^{(g)} = \sum_i C_{g,i}/N_g \qquad \text{Equation 12}$$

Figure 10:
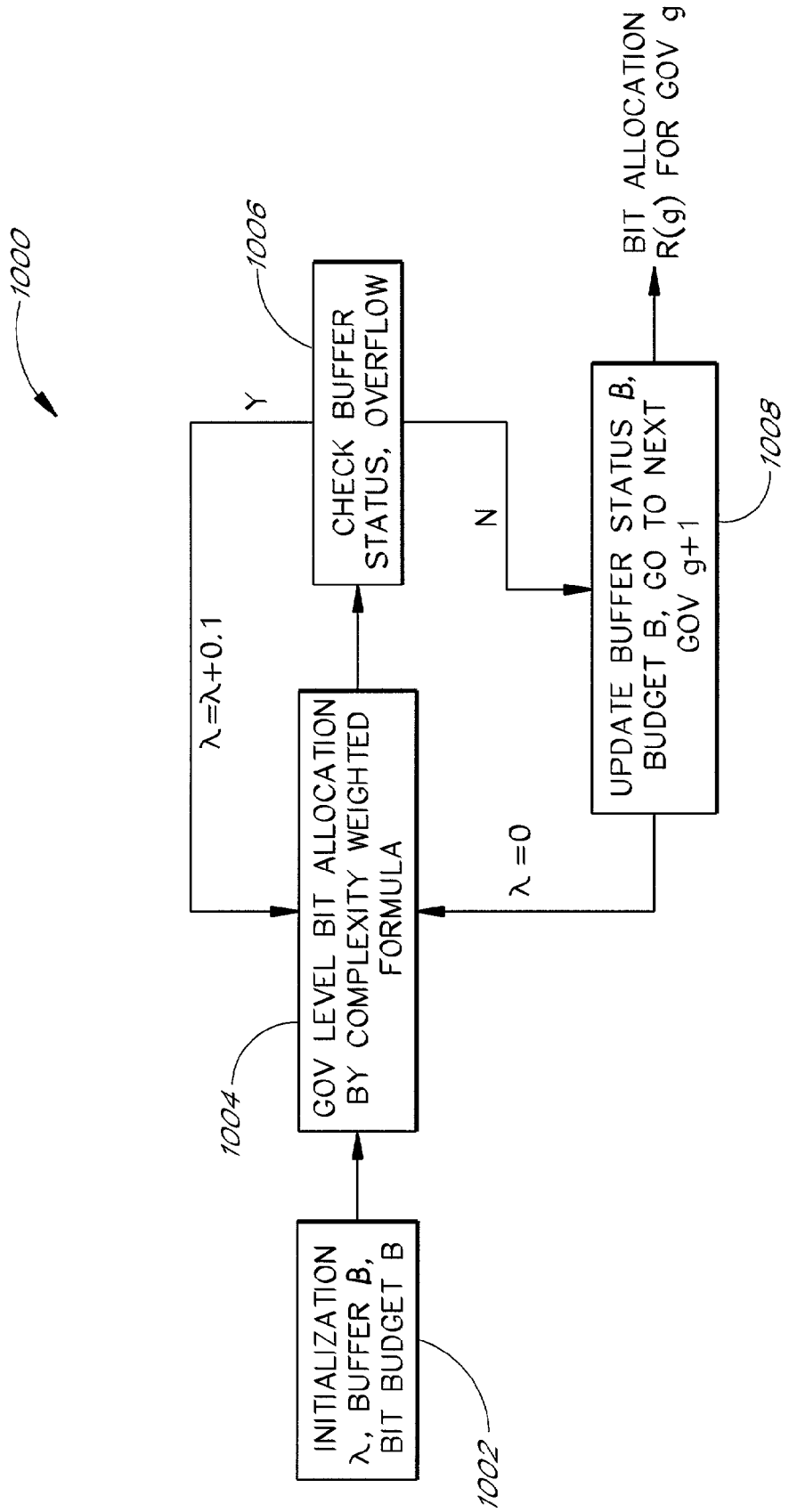
FIG. 10 illustrates an example scene level recursive bit allocation process.

Then, the GOV or GOP level recursive bit allocation process 1000 is applied, as illustrated in FIG. 10. At state 1002, an initialization process is performed, with the following assignments:

λ=0

Bit budget $B_r$ (bit allocation for a given time window corresponding to a certain number of GOVs or GOPs) =B The initial transmit buffer fullness $\beta_1 = T_d \times R$ Start from GOV or GOP of index 1, that is, the first GOV or GOP.

At state 1004, bits are assigned to the scene (GOV or GOP) of index g according to the following formula:

$$B_{t(g)} = \lambda \times (R/F) \times N_{(g)} + (1-\lambda) \times \frac{C_g \times N_g}{\sum_i C_i \times N_i} \times B_r \qquad \text{Equation 13}$$

Where:
R=the channel rate
F=the selected frame rate
$N_{(g)}$=the number of frames in GOV or GOP of index
g=the weighting factor between the buffer variation and complexity demands. and $\Sigma_i C_i \times N_i$ defines the total scene complexity for the given time window corresponding to the GOVs or GOPs under consideration The case of λ=0 represents the bit allocation scheme that directly follows the frame complexity, which is preferred if the transmit buffer constraints can be met. The assignment λ=1.0 represents the case where the bit budget is evenly distributed without considering the frame complexity. In this case, little pre-loading and a small capacity of the decoder buffer are needed as only the first frame needs to be pre-fetched. The case with 0<λ<1.0 represents a bit-allocation tradeoff between the buffer and the quality constraints.

At state 1006, the buffer status is inspected with the tentatively assigned bit budget $B_{t(g)}$, if $$\beta_{g-1}+B_{t(g)}-(R/F) \times N_{(g)} < \text{MarginFactor1} \times \beta_{max}$$

where, by way of example, MarginFactor1=0.8, which provides a safe margin (0.8 of the maximum buffer size) for buffer regulation.

then the allocation is accepted, and the process 1000 proceeds to state 1008. Otherwise, the value of λ is adjusted upwards by a factor, such as 0.1, and the process 1000 proceeds back to state 1004.

At state 1008 the buffer status is updated as follows:

$$\beta_g = \beta_{g-1}+B_{t(g)}-(R/F) \times N_{(g)},$$

and the remaining budget $B_r$ is adjusted as follows:

$$B_r - B_{t(g)}.$$

The process 1008 then proceeds back to state 1002 and the value of λ is set equal to 0. The allocation for the next GOV or GOP of index g+1 is then performed.

The GOV or GOP scene-level bit allocation advantageously suitably allocates the bit budget to each GOV or GOP while meeting both the buffer and the quality constraints. However, to obtain a constant or consistent quality within each GOV or GOP, it is preferable to allocate the bit budget according to frames within each GOV or GOP based on frame complexity and while still meeting buffer constraints. The frame level bit allocation process 904 illustrated in FIG. 9 performs such a frame bit allocation process, and is similar to the process 1000 for the GOV or GOP level bit allocation. However, rather then using variables corresponding to a GOP or a GOV, the variables corresponding to frames are utilized. Thus, for frames $$B_f = \lambda \times (R/F)+(1-\lambda) \times C_{(g,i)} \times Bg'/(C_{g'}) \qquad \text{Equation 14}$$

where:
Bg'=running bits=(Bit allocation for current GOP—used bits for frames already coded)
Cg'=running complexity=(complexity for current GOP—complexity of frames already coded)
R=target bit rate
F=frame rate In one embodiment, the macroblock level QP adjustment 906 can be alternatively performed in accordance with the following description. In the scene and the frame level bit allocation processes described above, a safe margin (0.8 of the maximal buffer by way of example) is provided for buffer regulation. To reduce computational complexity, in one alternative embodiment, all the macroblocks are quantized with the same quantization parameter (QP) using a one-pass rate control. The QP value is determined as part of the frame level rate control using the following iterative process:

If $B_{actual}(i)>1.15*B_r(i)$, then $QP_{i+1}=QP_i+1$.
If $B_{actual}(i) \geq 1.15*B_r(i)$
  then if $B_{actual}(i)<0.85*B_r(i)$
    $QP_{i+1}=QP_i-1$
  else $QP_{i+1}=QP_i$.
//To ensure that $QP_{i+1}$ is within the valid QP range of 1–31, the following clipping operation is performed
$QP_{i+1}=\max(QP_{i+1}, 1)$;
$QP_{i+1}=\min(QP_{i+1}, 31)$.

However, if the buffer is relatively small, then the macroblock level rate control process as described below can be used.

Suppose $N_{MB}$ is the number of macroblocks in one frame, $MAD_k$ is the mean absolute difference of MB k, and $QP_{k-1}$ is the QP for a previous macroblock. Then the QP for the current MB k can be in the range of $[QP_{k-1}-2, QP_{k-1}+2]$, as determined in accordance with the following rules:

$$QP_k = \begin{cases} QP_k - 2 & \text{if } R_{k-1} > 1.5 \times B_{k-1} \times \left(MAD_{k-1} \bigg/ \sum_{k-1}^{N_{MB}} MAD_m\right) \text{ else} \\ QP_k - 1 & \text{if } R_{k-1} > 1.25 \times B_{k-1} \times \left(MAD_{k-1} \bigg/ \sum_{k-1}^{N_{MB}} MAD_m\right) \text{ else} \\ QP_k + 2 & \text{if } R_{k-1} < 0.67 \times B_{k-1} \times \left(MAD_{k-1} \bigg/ \sum_{k-1}^{N_{MB}} MAD_m\right) \text{ else} \\ QP_k + 1 & \text{if } R_{k-1} < 0.8 \times B_{k-1} \times \left(MAD_{k-1} \bigg/ \sum_{k-1}^{N_{MB}} MAD_m\right) \text{ else} \\ QP_k \end{cases}$$

Equation 15

Optionally, in high noise environment, the macroblock bit allocation process can be disabled or not used so that the decoder can assume that the QP is the same for each macroblock. This helps prevent the decoder from using the wrong QP when portions of a frame have been corrupted or lost.

After determining the bit budget for each GOV or GOP, a novel rate control process, also referred to as IMP4, is used to meet or substantially meet the calculated bit budget. Conventional MPEG-4 rate control does provide adequate performance for many applications. For example, many conventional rate control processes do not explicitly support multiple scenes. Instead, these conventional rate control processes assume that an entire sequence comprises a single scene, and therefore fail to provide for satisfactory rate control. By contrast, an embodiment of the present invention takes into account when scene changes occur, and so provides enhanced rate control.

In one embodiment of the present invention, a self-converging rate control processed is used to meet the bit budget of each GOV by adjusting the quantization parameter QP of each frame, where QP is equal to half the quantization step size. In MPEG-4, the quantizer parameter QP can have 31 values [1–31]. The rate control process determines the QP based on past bit usage, the number of un-coded frame and the rest bits for a given GOV. Thus, if the current bit usage exceeds the assigned bit budget by more than a certain amount or percentage, the quantization parameter, and therefore the quantization step size, are increased. If, instead, the current bit usage falls beneath the assigned bit budget by more than a certain amount or percentage, the quantization parameter, and therefore the quantization step size, are decreased. The process can be performed in accordance with the following example pseudo-code:

if (current bit usage>assigned bit budget*Margin1)

$QP_{next}$=min(31, INT($QP$cur+StepUpPrcnt*$QP$cur));

Else if (current bit usage<assigned bit budget*Margin2)

$QP_{next}$=max(1, INT($QP$cur−StepDwnPrcnt*$QP$cur));

End if.
Where:

Margin1 is a constant that allows the current bit usage to exceed the assigned bit budget, so that the system has an opportunity to stabilize. For example, Margin1 can be set equal to 1.15, allowing the current bit usage to exceed the assigned bit budget by 15%.

Margin2 is a constant that allows the current bit usage to under-run the assigned bit budget, so that the system has an opportunity to stabilize. For example, Margin2 can be set equal to 0.85, allowing the current bit usage to under-run the assigned bit budget by 15%.

StepUpPrcnt is constant related to how much the quantization parameter is to be increased. For example, StepUpPrcnt may be set equal to 0.1.

StepDwnPrcnt is constant related to how much the quantization parameter is to be increased. For example, StepDwnPrcnt may be set equal to 0.1.

After encoding each GOV, the actual bit usage $B_{act}$ is compared with the pre-assigned bit budget $B_{ass}$, and if the actual bit usage varies by more then a certain amount or percentage (Margin3, Margin 4) from the budgeted bit usage, the quantization parameter QP for an I-frame (QPI) is adjusted up or down by a certain amount (StepUp, StepDwn) or percentage as needed. The quantization parameter adjustment process can be performed in accordance with the following example pseudo-code:

If ($B_{act}$>Margin3*$B_{ass}$)

QPI=QPI+StepUp;

Else if ($B_{act}$<Margin4*$B_{ass}$)

QPI=QPI−StepDwn;

End if
Where, by way of example:
Margin3=1.2
Margin4=0.8
StepUp=2
StepDwn=−2

The initial value of QPI may be set to 10, while the initial value of QP for a P-VOP may be set to 12. Note that when the quantization parameter QPI for I-VOP is changed, the QP assignment of the following P-frames may also change.

In one embodiment, the encoder module 106B then performs adaptive motion change detection to efficiently reduce large propagation errors. In particular, adaptive intra refresh (AIR) is used to reduce error propagation in an MPEG data stream by the selective intra-coding of macroblocks in p-frames. Thus, AIR is used to help determine how many macroblocks should be intra-encoded in the detected motion region of a frame. While the performance of macroblock intra-refresh increases error resilience of the compressed bitstream, increasing the number of intra-coded macroblocks correspondingly increase the number of bits used to encode these macroblocks. Further, if there is a fixed bit rate, the quantization error has to increase for the other, non-intracoded, macroblocks. Thus, preferably, bandwidth and the bit error probability (BER) are taken into account to determine the percentage or number of macroblocks that are to be intracoded.

In addition, the encoder module 106B optionally used Cyclic Intra Refresh (CIR) to encode a predetermined number of macroblocks (MBs) in each frame. Thus, CIR provides periodic intra-refresh to constrain possible error propagation.

In one embodiment, Cyclic Intra Refresh (CIR) and Adaptive Intra Refresh (AIR) are performed as follows. The number of Intra macroblocks in a VOP is specified by the user in the encoder parameter file. The number of Intra macroblocks in a VOP depends on target bit rate, frame rate, bit buffer usage, channel noise feedback, and other transmission related parameters. The encoder module 106B estimates the amount of motion for each macroblock and selects heavy motion area to be encoded in INTRA mode to enhance error resiliency. The results of the estimation are recorded a refresh map at the macroblock level.

Figures 2A, 2B:
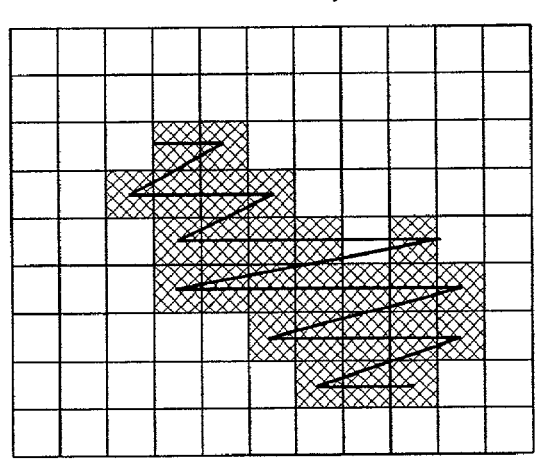
FIGS. 2A–B illustrate an example refresh map and an example scan order that can be used with an embodiment of the present invention.

An example conventional refresh map 202 is illustrated in FIG. 2A. The encoder module 106B refers to the refresh map and selectively determines whether to encode a given macroblock of the current VOP in INTRA mode or not. The estimation of motion is performed by comparing SAD (Sum of the Absolute Difference) and $SAD_{th}$. SAD refers to the Sum of the Absolute Differences value between the current macroblock and the macroblock in the same location of the previous VOP. Advantageously, the SAD is already calculated when performing motion estimation. Therefore, the SAD calculation does not have to be repeated as part of the AIR process. $SAD_{th}$ is used as a threshold value in determining whether a given macroblock is a motion area. If the SAD of the current macroblock is larger then $SAD_{th}$, this macroblock is regarded as motion area.

Once a macroblock is regarded as a motion area, it remains as a candidate motion area until it is encoded in Intra mode a predetermined number of times. In the example refresh map 202 illustrated in FIG. 2A, the value for this "predetermined number of times" is set "1," in other embodiments, the predetermined number of times can be set equal to 2, or a higher value. Horizontal scanning is used to resolve among macroblocks that are candidates to be encoded in Intra mode within the moving area as illustrated in map 204 in FIG. 2B.

Figure 8A:
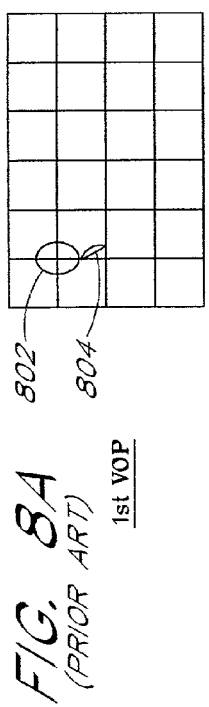
FIGS. 8A–H illustrate example processes for adaptive intra refresh.

With reference to FIG. 8A, conventional AIR processing, as applied to four sample sequential VOPs, will now be explained in greater detail. The AIR refresh rate, that is, the fixed number of Intra macroblocks in a VOP is preferably determined in advance. In this example, the number of Intra macroblocks in a VOP is set to "2".

[1] 1st VOP—FIG. 8A[a] and [b]

The first VOP is a scene change frame containing elements 802, 804. Therefore, all macroblocks in the 1st VOP are encoded in Intra mode, as illustrated in FIG. 8A[a]. As illustrated in FIG. 8A[b], the refresh map is set to "0", where a 0 indicates that an Intra refresh is not to be performed and a 1 indicates that an Intra refresh is to be performed, because the 1st VOP is encoded without reference to a previous VOP.

[2] 2nd VOP—FIG. 8A[c]–[f]

The 2nd VOP is intercoded as a P-VOP. Elements 802, 804 have moved down one macroblock and to the right by one macroblock. Intra refresh is not performed in this VOP, because all values in the refresh map are still zero, as illustrated in FIG. 8A[c]. The encoder module 106B estimates motion of each macroblock. If the SAD for a given macroblock is larger than $SAD_{th}$, the given macroblock is regarded as motion area, illustrated by the hatched area in FIG. 8A[e]; thus, the refresh map is updated as illustrated in FIG. 8A[f], where the refresh map entry corresponding to a motion macroblock is set to 1.

[3] 3rd VOP—FIG. 8A[g]–[k]

Elements 802, 804 have moved down by an additional macroblock and to the right by an additional macroblock. When the 3rd VOP is encoded, the encoder module 106B refers to the Refresh Map illustrated in FIG. 8A[g]. If the refresh map indicates that a macroblock is be Intra refreshed, the macroblock is encoded in Intra mode, as illustrated by the macroblocks containing an "X" in FIG. 8A[h]. The corresponding refresh map value for an intracoded macroblock is decreased by 1 as illustrated in FIG. 8A[i].

If the decreased value is 0, the corresponding macroblock is not regarded as a motion area. Proceeding, the processing is substantially the same as that for the 2nd VOP as illustrated in FIG. 8A[j]–[k], where if the SAD for a given macroblock is larger than $SAD_{th}$, the given macroblock is regarded as motion area. The refresh map is updated as illustrated in FIG. 8A[k], where the refresh map entry corresponding to a motion macroblock is set to 1.

[4] 4th VOP—FIG. 8A[l]–[p]

The processing is substantially the same as for the 3rd VOP. If a current macroblock has a 1 associated with it in the refresh map, it is encoded in Intra mode as illustrated by the macroblocks containing an "X" in FIG. 8A[m]. The corresponding refresh map value for an intracoded macroblock is decreased by 1 as illustrated in FIG. 8A[n].

If the decreased value is 0, the corresponding macroblock is not regarded as a motion area. If the SAD for a given macroblock is larger than $SAD_{th}$, the given macroblock is regarded as motion area. The refresh map is updated as illustrated in FIG. 8A[p].

In another embodiment, a novel enhanced AIR process is performed as follows to select which macroblocks are to be intracoded in a predicted frame. An intercode distortion value and an intracode distortion value are calculated, as are an intercode bit rate and an intracode bit rate. Based on a comparison of the calculated intercede distortion value and the intracode distortion value, and on a comparison of the intercode bit rate and the intracode bit rate for each macroblock, a decision is made as to which macroblocks are to be intracoded. The enhanced AIR process will now be described in greater detail.

In order to select which prediction frame macroblock is to be intracoded, the expected distortion that would result if the macroblock were lost or corrupted is estimated. For a predicted or intracoded macroblock, the distortion can be reduced if the reference macroblock in the prediction is intracoded.

Figure 8B:
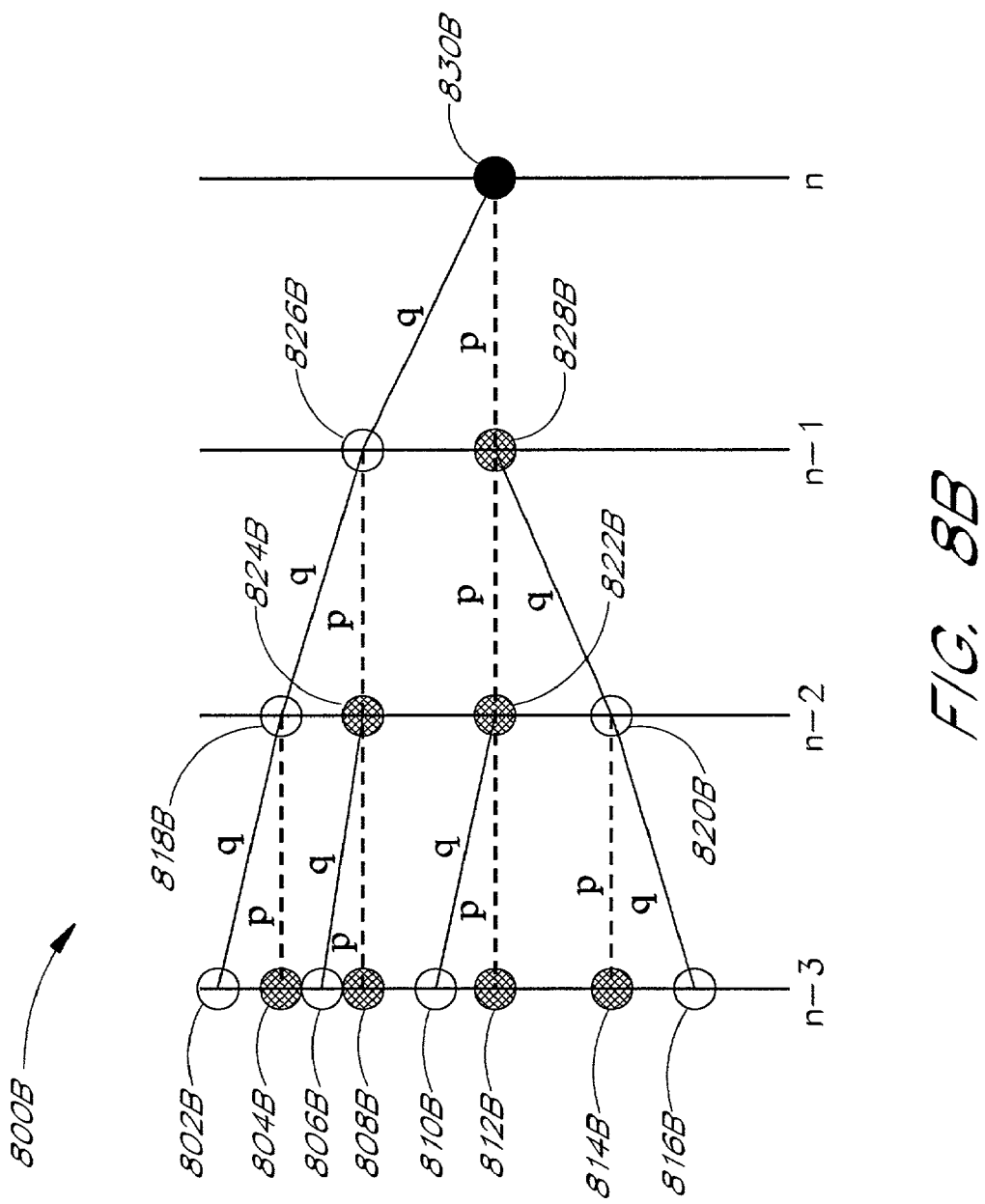

With reference to FIG. 8B, recursive tracking in conjunction with the prediction path can be used to determine the expected distortion of the macroblock. The dashed lines 804B to 818B, 806B to 820B, 820B to 826B, 812B to 822B, 814B to 824B, 822B to 828B, and 828B to 830B, indicate motion vectors (MV) that are part of the encoded bitstream from a macroblock in the previous frame to a macroblock in the current frame. The angled solid lines, such as those from 802B to 818B, 806B to 820B, 810B to 822B, 816B to 824B, 818B to 826B, 824B to 828B, and 826B to 830B, indicate a zero-motion vector, where a lost motion vector is set to zero. Zero motion vectors are used by a decoder in an error condition, wherein the decoder, for error concealment, replaces an unrecoverable macroblock with a corresponding macroblock from a previous frame. Note that this is just one of the available error concealment strategies, which is termed "basic concealment." Other concealment strategies, such as temporal concealment or supplemental motion vector concealment can be performed as well. Optionally, the effects of these other error concealment strategies are considered separately, in parallel, when performing the recursive tracking. Referring to FIG. 8B, "p" is the packet loss probability or rate, and q=(1−p).

While encoding a given current macroblock, the encoder module 106B performs a motion search on the previous frame and locates a macroblock that most closely matches the current macroblock or is otherwise determined to be a good prediction frame. This located macroblock from the previous frame, depicted by a non-hatched circle, such as macroblocks 802B, 806B, 810B, 816B, 818B, 820B, 826B, is called a prediction macroblock. After the motion search is performed, a residual error is calculated and further encoded using the Discrete Cosine Transform (DCT), then quantized using a selected quantization step or quantization parameter (QP), and entropy coded using variable length coding (VLC). The encoded bitstream consists of motion vector information, entropy coded quantized DCT coefficients for the residual error, and corresponding header information.

When the decoder receives the encoded bitstream, the decoder processes the coded information and reconstructs the macroblocks. When information for a macroblock is missing, which may be due to packet loss or other error conditions, the decoder preferably conceals the corresponding macroblock using one or more error-concealment strategies, such as the basic concealment discussed above. As discussed above, when a macroblock is missing, basic concealment copies a macroblock at the same spatial location from the previous frame. This is equivalent to receiving a zero-motion vector and zero DCT coefficients.

In order to determine which macroblocks should be intracoded, in one embodiment the encoder system 100 includes corresponding decoder circuitry so that it can mimic the decoder process and reconstruct what the decoder will reconstruct both in the absence of errors, and in the presence of one or more errors, such as a single error affecting just the current macroblock ("MBC"). By way of example, the difference between the error-free reconstruction and the reconstruction assuming one error is termed "concealment error" or EC. EC is defined as follows:

$$EC=MBQ-MBC \qquad \text{Equation 16}$$

Where MBQ is the error free reconstruction, and MBC is a single error reconstruction When a given macroblock is used as a prediction macroblock for the next frame, an error present on the given macroblock will propagate to those macroblocks in the next frame that use the given macroblock for prediction purposes, even when there is no further error in motion vectors and DCT coefficients for those next-frame macroblocks. The mechanism with which error propagates from a macroblock in a given frame to other macroblocks in the next frame is termed "the error propagation model."

Error attenuation occurs when half-pixel accuracy is used for prediction either in the vertical or horizontal direction or in both the vertical and the horizontal directions. Error attenuation, comparable to a low pass filter, occurs as a result of the low-pass frequency characteristic of the pixel averaging operation applied when half-pixel motion is used. Thus, given the concealment error EC calculated at the encoder system 100B, the propagated error via half-pixel motion in the horizontal direction ECh/2, the propagated error via half-pixel motion in the vertical direction ECv/2, and the propagated error via half-pixel motion in the horizontal and vertical direction EChv/2, can be determined.

Figure 8C:
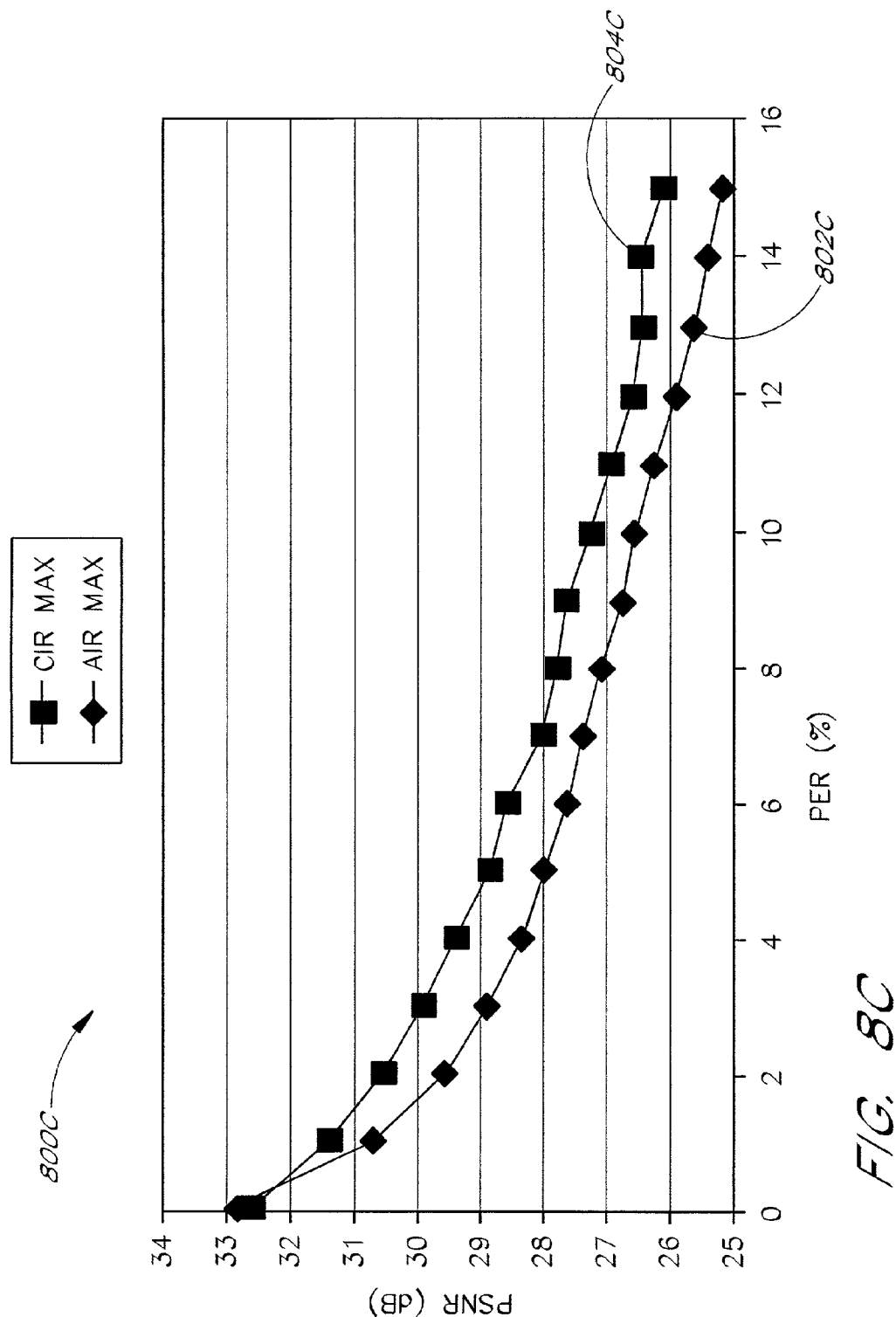
Figure 8D:
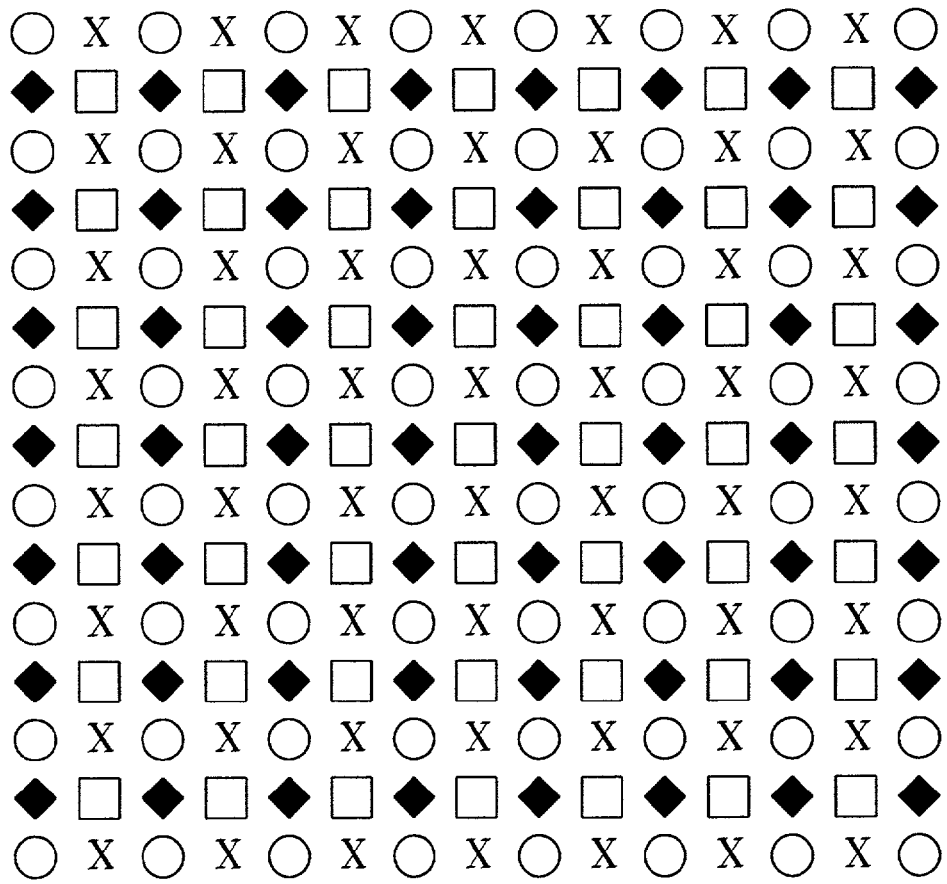

Half pixel interpolation is illustrated in FIG. 8D, showing integer pixel locations, half-pixel locations in the horizontal direction, half-pixel locations in the vertical direction, and half-pixel locations in the horizontal and vertical dimension.

The half-pixel averaging filter that is normally applied to pixel values can be applied to the concealment error, EC, to define four types of propagated error arrays:

EC0=EC

ECh/2=error through horizontal half-pixel motion (value calculated on crosses "x" in FIG. 8D)

ECv/2=error through vertical half-pixel motion (value calculated on diamonds in FIG. 8D)

EChv/2=error through horizontal and vertical half-pixel motion (value calculated on squares in FIG. 8D)

For each of the four error arrays, the corresponding energy, which approximates the error variance under the hypothesis of zero mean, is calculated.

The four error variances for these four cases can correspondingly be defined as:

$$\sigma_{Ec}^2, \sigma_{Ech/2}^2, \sigma_{Ecv/2}^2 \text{ and } \sigma_{Echv/2}^2 \qquad \text{Equation 17}$$

The following four transition or strength factors can then be defined as:

$$\gamma_{Ec} = \frac{\sigma_{Ec}^2}{\sigma_{Ec}^2} - 1 = 0, \gamma_{h/2} = \frac{\sigma_{Ec}^2}{\sigma_{h/2}^2} - 1, \qquad \text{Equation 18}$$

$$\gamma_{v/2} = \frac{\sigma_{Ec}^2}{\sigma_{v/2}^2} - 1 \text{ and } \gamma_{hv/2} = \frac{\sigma_{Ec}^2}{\sigma_{hv/2}^2} - 1$$

which correspond to the four possible cases of motion for the current macroblock. These quantities are saved, together with the motion vector that is used to encode the current macroblock, $(m_x, m_y)$, the initial error energy $\sigma_{Ec}^2$, and the coding mode (Intra/Inter), in a table, file or other record.

The half-pixel horizontal and vertical propagation strength can be approximated as follows:

$$\gamma_{hv/2} = \gamma_{h/2} + \gamma_{v/2} + \gamma_{h/2}\gamma_{v/2} \qquad \text{Equation 19}$$

using the transition factors of half-pixel horizontal and half-pixel vertical motion, thereby reducing the computation time and resources needed to calculate half-pixel horizontal and vertical propagation strength or transition factor. In addition, the propagation strengths should be positive. Therefore, a negative propagation strength result will be rounded or set to zero.

Figure 8E:
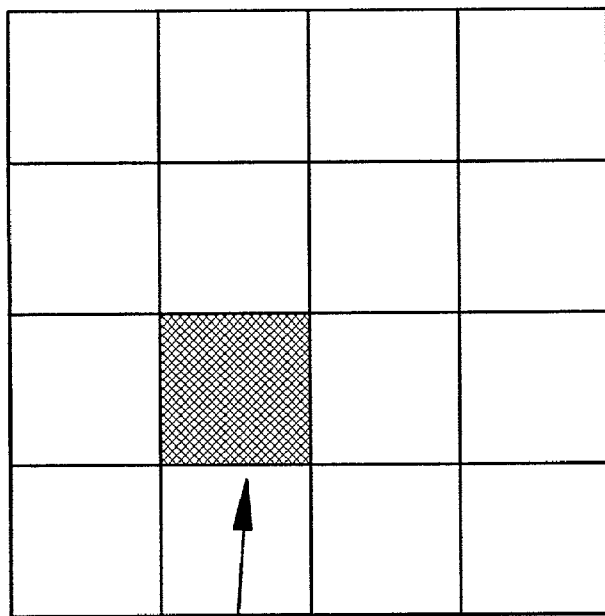
Figure 8E:
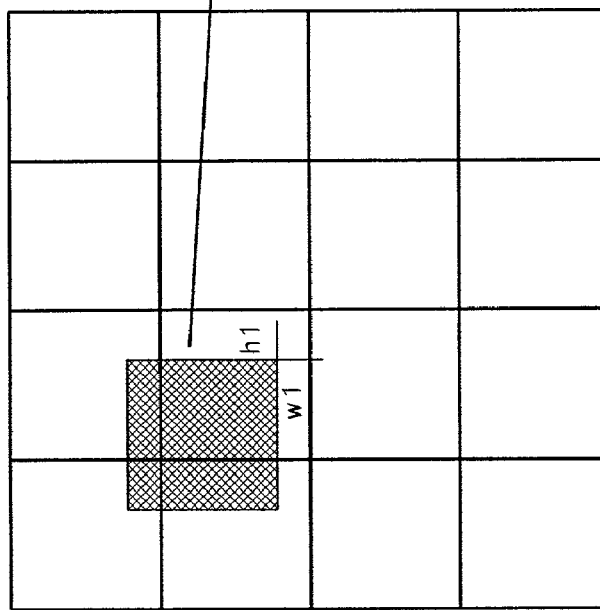

As illustrated in FIG. 8E, a motion vector MV can map macroblocks in the current frame Frame$_n$, aligned with a grid of 16-pixel rows and columns, into 16×16 pixels in the predicted frame Frame$_{n-1}$, that are not necessarily aligned on the same grid. Indeed, as illustrated in FIG. 8E, a macroblock in Frame$_n$ can map to portions of up to four macroblocks in the predicted frame Frame$_{n-1}$.

An error present on one or more of the four possible macroblocks from the previous frame used for prediction for a macroblock in the current frame will be reflected in the macroblock in the current frame. The error relationship can be proportional to the overlap area. For example the error relationship can be proportional or based on the number of pixels that they overlap. Thus, for each macroblock in the current frame, the up to four prediction macroblocks are identified that would be used when encoding the macroblock in Inter mode. Using the corresponding motion vector information, the overlapping area is determined, and a weighting factor equal or related to that area is used to normalize the overlap area to the total macroblock area, 256 (=16×16) for example, as defined by the following equation:

$$\sigma_v^2(i, j) = w(i, j)\frac{\sigma_u^2(i)}{1 + \gamma_{i,j}}$$

that estimates the expecting distortion on macroblock j in current frame due to macroblock i in previous frame. Note that $\gamma_{i,j}$ is one of the transition factors $\gamma_{EC}, \gamma_{h/2}, \gamma_{v/2}$ and $\gamma_{hv/2}$ defined previously, depending on the type of motion (half or integer pixel motion vector) along horizontal, vertical or both directions and $$w(i, j) = \frac{w1 \cdot h1}{256}$$

is the weighting factor relating the area of overlap (w1×h1) between macroblock j and macroblock i. The term $\sigma_u^2(i)$ is the concealment error $\sigma_{EC}^2$ for macroblock i.

With reference to FIG. 8B, beginning with the macroblock 830B in current Frame$_n$, there are two macroblocks in Frame$_{n-1}$ that may be used by a decoder to recreate macroblock 830B, a macroblock 826B used for normal decoding, and a macroblock 828B used for concealment. Each of the macroblocks 826B, 828B in Frame$_{n-1}$ may correspond to up to 4 aligned macroblocks, as discussed above. The same "decode or conceal" strategy can be recursively applied for the two macroblocks 826B, 828B in Frame$_{n-1}$ to locate 4 macroblocks 818B, 824,B, 822B, 829B in Frame n−2, and then reach Frame$_{n-3}$ with 8 macroblocks 802B, 804B, 806B, 808B, 810B, 812B, 814B, 816B, and so on. Each of the 8 macroblocks in Frame$_{n-3}$ has a probability of appearing in Frame$_n$ at the current macroblock, if a certain series of errors/packet loss occurs during transmission. The probability of each one of these 8 paths is the product of the corresponding branch probability (p/q), where p is the packet loss probability and q=(1−p). The probability of a particular path to the macroblock 830B occurring can be determined by multiplying the p and q values along the path. Thus, there exist paths that have probability $p^2$, such as those where two packet losses in a row occur, and a path defined by 812B–830B with probability $p^3$.

Figure 8F:
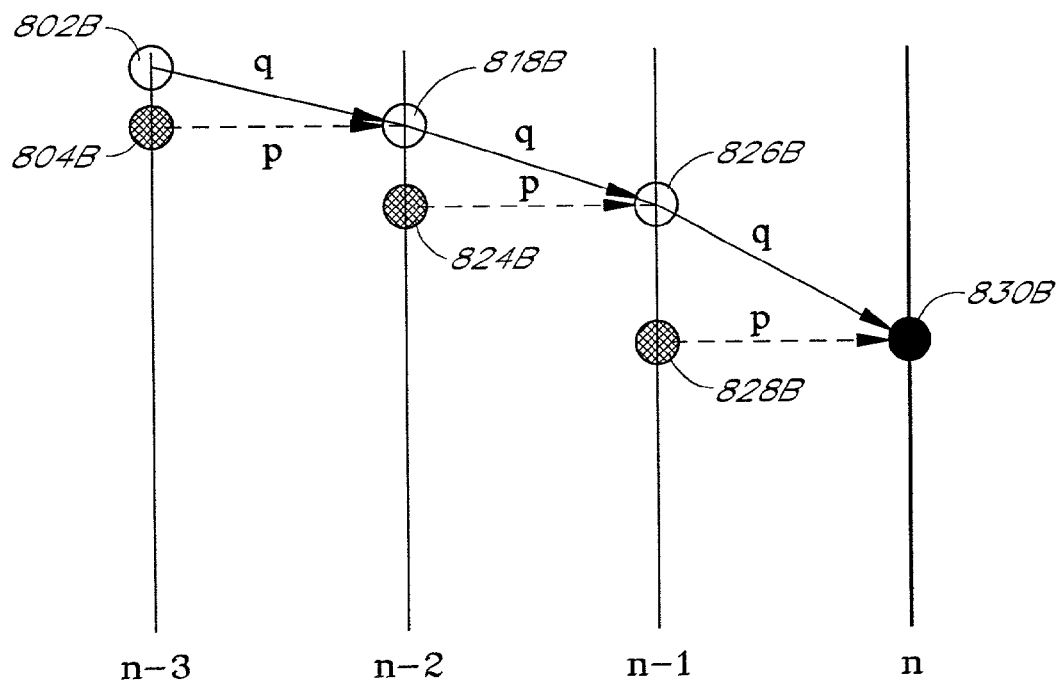

Assuming a relatively small probability of error (e.g. 0.1), the higher-order (with respect to p) paths, such as those with a probability of $p^2$ or $p^3$, can be neglected, and FIG. 8B can thereby be simplified to the paths illustrated in FIG. 8F. The reductions in paths in FIG. 8B is based on an assumption that a macroblock that is to be used for concealment is not itself corrupted, that is, the probability is neglected of multiple error/packet loss on a certain path between two macroblocks. While this assumption may not always be true, it will most often be true.

Based on this simplified macroblock relationship, the expected distortion for the current macroblock in Frame$_n$ can be estimated using the propagation model described above. The expected distortion is defined using the following equation:

$$D(n) = p\sigma_{EC}^2(n) + qD'(n-1) \qquad \text{Equation 20}$$

where D'(n−1) is the expected distortion for the reference macroblocks in Frame$_{n-1}$, as modified by the transition factors to take into account the possible half-pixel motion from Frame$_{n-1}$ to Frame$_n$. Expanding this formula for the reference macroblock in Frame$_{n-1}$, expected distortion is defined as follows:

$$D(n) = p\sigma_{EC}^2(n) + q\left(p\frac{\sigma_{EC}^2(n-1)}{1 + \gamma_{(n-1,n)}} + qD''(n-2)\right) \qquad \text{Equation 21}$$

$\gamma_{(n-1,n)}$ is one of the 4 transition factors ($\gamma_{EC}, \gamma_{h/2}, \gamma_{v/2}$ and $\gamma_{hv/2}$) for the reference macroblock in Frame$_{n-1}$, depending on the motion vector from Frame$_{n-1}$ to Frame$_n$. As similarly described above, D"(n−2) is the expected distortion for the reference macroblocks in Frame$_{n-2}$ as modified by the transition factors to take into account the possible half-pixel motion from Frame$_{n-2}$ to Frame$_{n-1}$ and from Frame$_{n-1}$ to Frame$_n$. Expanding this term further, the expected distortion is defined as:

$$D(n) = p\sigma_{EC}^2(n) + q\left(p\frac{\sigma_{EC}^2(n-1)}{1 + \gamma_{(n-1,n)}} + \right.$$
$$\left. q\left(p\frac{\sigma_{EC}^2(n-2)}{1 + \gamma_{(n-2,n-1)} + \gamma_{(n-1,n)}} + qD'''(n-3)\right)\right) \qquad \text{Equation 22}$$

If Frame$_{n-3}$ is an I-frame or if the frame buffer is limited or restricted to 3 frame, then D'''(n−3) is equal to zero. Otherwise, the same procedure is recursively applied to previous frame macroblocks. Similarly, if an Intra macroblock is encountered during the recursive processes, it is assumed that the distortion is equal to $p\sigma_{EC}^2$, because there is no motion vector, and thus no error-propagation term.

For the above distortion equations, contributions from each one of a maximum of 4 prediction macroblocks in each frame are summed and multiplied by the corresponding weighting factor that relates the area of overlap between each one of these macroblocks with the target macroblock in Frame$_n$.

The information stored for each macroblock of previous frames can be utilized to calculate the expected distortion for each macroblock for the current Frame$_n$. Note that this expected distortion is due to errors in transmission and is not correlated to the distortion due to quantization for each macroblock. Therefore, the expected distortion term needs to be added to the quantization error to determine the total distortion for each macroblock. This total distortion is referred to as "total Inter-mode distortion," or D$_{TINTER}$, as it relates to Inter mode encoding of macroblocks.

For Intra mode, the expected distortion reduces to the first term as follows:

$$D(n) = p\sigma_{EC}^2(n) \qquad \text{Equation 23}$$

reflecting the expected error distortion that needs to be added to the corresponding Intra-mode quantization distortion in order to get the "total Intra-mode distortion" for the macroblock, also referred to as D$_{TINTRA}$.

A certain number of bits are needed for the Inter mode encoding and the Intra mode encoding, respectively referred to as R$_{TINTER}$ and R$_{TINTRA}$. The difference between these bit rates, $\Delta R = R_{INTRA} - R_{INTER}$, together with the difference in total distortion, $\Delta D = D_{INTRA} - D_{INTER}$ can be used to select the best coding mode.

If the encoder has sufficient resources and capability, a full Rate-Distortion optimization can be performed that involves determination of an optimal weighting factor λ to be used for evaluating a cost function for each macroblock, given by:

$$C = D + \lambda R \qquad \text{Equation 24}$$

and thus obtain the following Intra/Inter decision rule:
Choose Intra mode, when
ΔD<0, if ΔR=0

$$\frac{\Delta D}{\Delta R} < -\lambda, \text{ if } \Delta R > 0$$

$$\frac{\Delta D}{\Delta R} > -\lambda, \text{ if } \Delta R < 0$$

Else select Inter mode

Note that determination of the optimal λ parameter is optionally achieved by trying all possible QP and λ combinations. The particular combination that results in the least distortion among all combinations that produce bitstreams below or optionally equal to the desired bit rate is then selected.

Alternatively, the encoder system 100 can first choose macroblocks that satisfy the first of the above listed cases (ΔD<0, if ΔR=0), since it is applicable to all values of λ, and also all macroblocks that satisfy the condition $$\frac{\Delta D}{\Delta R} \geq 0,$$

if ΔR<0, which automatically applies to the third case. Then macroblocks with ΔR>0 are grouped together and ordered in increasing order with respect to the ratio $$\frac{\Delta D}{\Delta R}.$$

Similarly, the macroblocks with ΔR<0 are grouped together and ordered in decreasing order with respect to the same ratio, $$\frac{\Delta D}{\Delta R}.$$

Figure 8G:
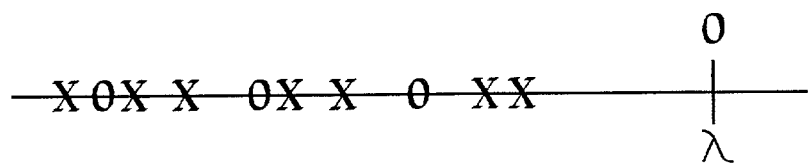

This is shown by the graph illustrated in FIG. 8G, representing the value of the ratio $$\frac{\Delta D}{\Delta R}$$

for each macroblock, where "x"s indicate those macroblock with ΔR>0 and "o"s indicate those with ΔR<0.

The "x"s that have the most negative values, or negative values that meet corresponding defined criteria, and the "o"s that have the least negative values, or negative values that meet corresponding defined criteria, are selected as candidates for Intra Refresh. Note that "o"s with a positive value have already been chosen for Intra coding, and "x"s with positive value are excluded altogether as they are automatically intracoded. Experimental results indicates that macroblocks with ΔR>0, indicated by an "x", are the most common ones, because generally Intra mode costs more, as measured in bits, compared to Inter mode. Thus, optionally only macroblocks with ΔR>0 will be considered for Intra refresh. The so-called refresh rate, specifying how many additional macroblocks are to encoded in intra mode, then dictates how many of the candidate macroblocks are eventually chosen.

A less resource intensive process is to calculate the expected distortion for each macroblock due to transmission error, while ignoring or excluding quantization error. Then, the differential between the expected distortion for Intra and Inter mode can be used as the criterion for selecting macroblocks to be Intra coded by ordering them according to this criterion.

Thus, Adaptive Intra Refresh (AIR) can be used to help determine how many macroblocks should be intra-encoded in the detected motion region of a frame. AIR can be enabled and disabled in the encoder parameter file using an AIR bit set by a user and read by the encoder module 106B. When AIR is enabled, the user also specifies another parameter, the AIR refresh rate. The AIR refresh rate determines how many macroblocks should be intra-coded in the detected motion region of one frame. Adaptive motion change detection can efficiently reduce the large propagation error, even when the error occurs in the motion region.

Figure 8H:
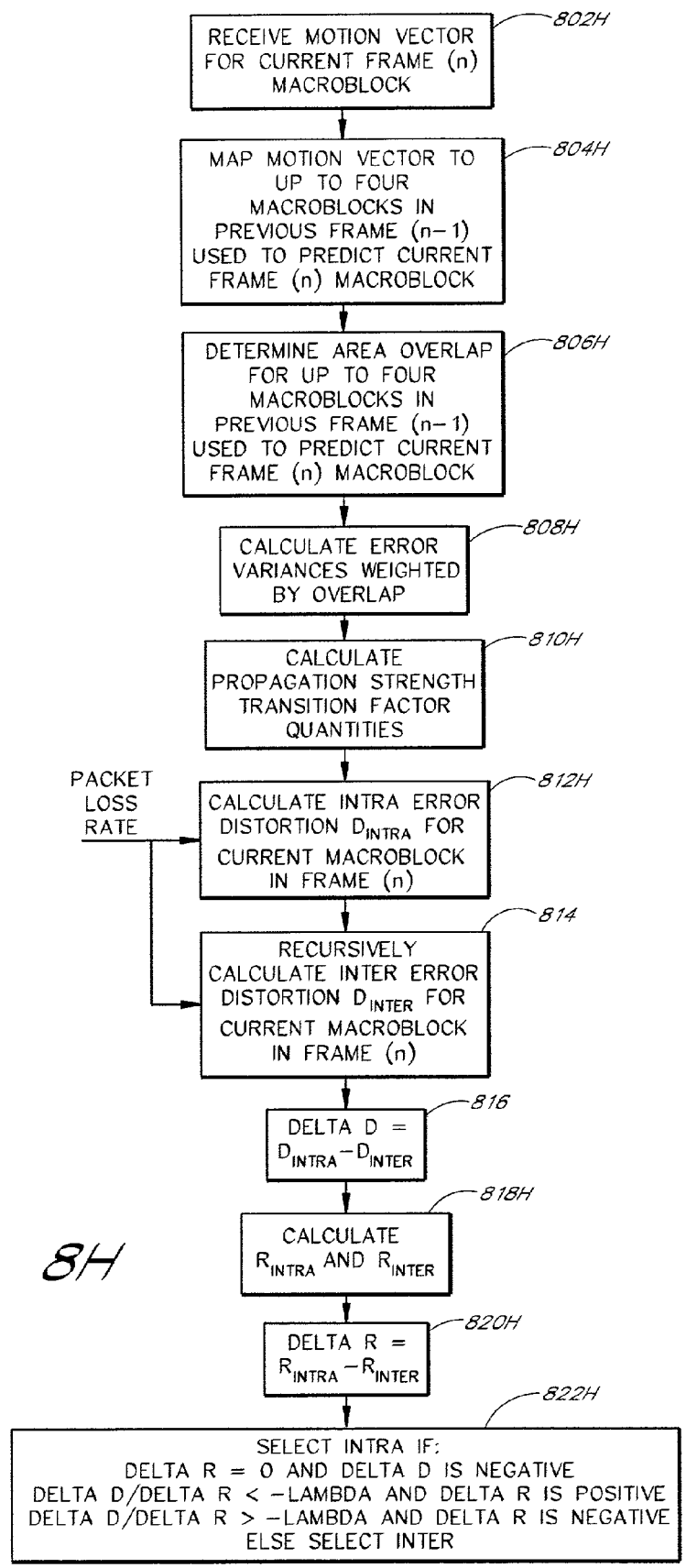

FIG. 8H illustrates an embodiment of the E-AIR process. At state 802H, the motion vector or vectors for the current macroblock of interest in Frame (n) are received. At state 804H the motion vector is used to locate which macroblocks from a previous Frame (n−1) are to be used in predicating the current macroblock. At state 806H a determination is made as to how much, in terms of area or pixels, of each of the located macroblocks in Frame (n−1) will be used in generating the current macroblock. At state 808H, the error variances ($\sigma^2_{Ec}$, $\sigma^2_{Ech/2}$, $\sigma^2_{Ecv/2}$, $\sigma^2_{Echv/2}$) are calculated, including the overlap weighting $$\left( w(i,j) \frac{1}{1 + \gamma_{i,j}} \right).$$

At state 808H the propagation strength transition quantities are calculated based on the error variances. At state 812H, the Intra Error Distortion $D_{INTRA}$ for Frame (n) is calculated. At state 814H, the Inter Error Distortion $D_{INTER}$ for Frame (n) is recursively calculated. As discussed above, the recursive calculation can include the error distortion and quantization distortion from previous frames, such as Frame (n−1), Frame (n−2), and so on, whose errors may propagate to Frame (n). The recursion may be limited to a predetermined number of frame generations, until all or a predetermined amount of the frame buffer is being used, or the recursion may stop when an Intra frame is reached.

At state 816, the value DeltaD is calculated by taking the difference between $D_{INTRA}$ and $D_{INTER}$, or by otherwise comparing $D_{INTRA}$ and $D_{INTER}$. At state 818H the bit quantity or bit rate $R_{INTRA}$ and $R_{INTRA}$ for intracoding Frame (n) and for interceding Frame (n) respectively are determined. At state 820H a comparison of $R_{INTRA}$ and $R_{INTER}$ is made by calculating the difference DeltaR. At state 822H the decision to intracode or to intercode is made based on DeltaR, DeltaD and Lambda using the illustrated criteria.

Alternatively, those macroblocks having a DeltaD may be chosen for intracoding. For example, after DeltaD is calculated for all of Frame (n)'s macroblocks, the two macroblocks having the largest DeltaD are intracoded. The macroblock intracode selection may also be based on a cost calculation where the Cost=Rate+lambda*D, or D+lambda*R, and choose the highest N (=AIR rate)

FIG. 8C illustrates experimental results comparing the use of Cyclic Intra Refresh, trace 802C, with the use of the enhanced AIR method described immediately above, trace 804C. The overall gain is approximately 1 dB in the PSNR. In one embodiment, the additional computational load is approximately 10%.

In order to utilize AIR more effectively, conventional Cyclic Intra Refresh (CIR) is combined with AIR. The number of the Intra Refresh macroblocks in a VOP is defined as the summation of the AIR_refresh_rate and the CIR_refresh_rate. AIR_refresh_rate macroblocks are encoded in AIR mode and CIR_refresh_rate macroblock are encoded in the conventional CIR mode. These values are user definable in the encoder parameter file. When the channel degrades, higher CIR and AIR rates should preferably be assigned. In addition, when the distance between I-frames is large, higher CIR and AIR rates should preferably be assigned. These rates are preferably varied adaptively with changing channel conditions as well as with the coding parameters to improve the tradeoff between error resilience and coding efficiency.

The encoder parameter file specifies many different encoding parameters, including those discussed above. The encoder parameter file can be used in conjunction with the preprocessing module output by reading the frame-type file, which specifies the encoding type are determined by preprocessing process described above. By way of example, the encoder parameter file includes fields to enable/disable AIR, CIR, and SMC, to specify the AIR and CIR refresh rates, and a flag used to enable or disable the inclusion of two I-frames at the beginning of each scene, GOV or GOP.

The encoder parameter file has the following parameters or fields:

TABLE 1

Encoder parameter specification.

| | |
|---|---|
| Version | Version number and/or name |
| Source.Width | specifies frame width |
| Source.Height | specifies frame height |
| Source.FirstFrame | specifies the first frame to be encoded (counting from 0) |
| Source.LastFrame | specifies the last frame to be encoded |
| Source.Directory | Directory to store the original source of sequence without trailing "\" |
| Source.SamplingRate | Allows sub-sampling the original source based on this sampling rate parameter |
| Output.Directory.Bitstream | Output bitstream directory |
| Output.Directory.DecodedFrames | Directory to put the reconstructed frames from the encoder (encoder also performs decoding) |
| RateControl.Type [0] | What type of rate control-one of "None" (maintain constant QP), "MP4" (for IMP4), "TM5" (for Test Model 5); |
| RateControl.BitsPerVOP [0]: | bit budget for the entire sequence |
| Quant.Type [0] | One of "H263", "MPEG". For low bit rate communications, H263 is preferred. |
| GOV.Enable [0] | GOV header present or not |
| GOV.Period [0] | Number of VOPs between GOV headers |
| Texture.QuantStep.IVOP [0] | Quantization Parameter (QP) for I-VOP; not affected by rate control |
| Texture.QuantStep.PVOP [0] | QP for P-VOP if rate control is disabled |
| Texture.QuantStep.BVOP [0] | QP for B-VOP if rate control is disabled |
| Motion.PBetweenICount [0] | In case of multiple scenes, and in the presence of a frame-type file, the encoder ignores this parameter. Else, the length of a GOP is specified before source subsampling. A negative value means one GOP for the whole sequence. |
| Motion.ReadWriteMVs [0] | One of "Off", "Read", "Write" |
| Motion.ReadWriteMVs.Filename [0] | Filename for Read/write MV from/to files |
| ErrorResil.RVLC.Enable [0] | Enable or disable RVLC-0: disable; 1: enable |
| ErrorResil.DataPartition.Enable [0] | Enable or disable data partitioning |
| ErrorResil.VideoPacket.Enable [0] | Enable or disable introduction of resync markers in video packet (VP) |
| ErrorResil.VideoPacket.Length [0] | If VideoPacket enables, the size of VP in bits-select based on the target bit rate |
| ErrorResil.SMC.Enable | Enable/disable second motion compensation (SMC). When = 1, only 1 PVOP; when = 2, for all PVOP |
| ErrorResil.AIR.Enable | Enable/disable adaptive intra refresh (AIR) |
| ErrorResil.CIR.Enable | Enable/disable cyclic intra refresh (CIR) |
| ErrorResil.AIR.Rate | Added for specifying the AIR rate. an AIR rate of 2, for example, may be used. |
| ErrorResil.CIR.Rate | When enabling CIR (see above), specifies the CIR rate (Macroblocks per VOP). A CIR rate of 2, for example, may be used. |
| ErrorResil.2I.Enable | Added to enable/disable double I-frame coding in each GOV for enhanced error-resilience |

To further increase error resiliency, a Header Extension Code (HEC) is included by the encoder module 106B in every packet in a sequence of video packets or in every video packet, and not just on the first video packet following the VOP header as with conventional encoders. This better ensures that even if a packet is lost or corrupted, subsequent packets can still be decoded and used. Further, even typical conventional decoders will be able to handle the inclusion of the enhanced use of HECs as the use of additional HECs is compatible with the MPEG-4 bitstream syntax. Adding a header, including sequence information, to all packets increases overhead by only about 40 bits per packet, or about 0.2%, but results in a noticeable improvement in decoding.

Figure 5:
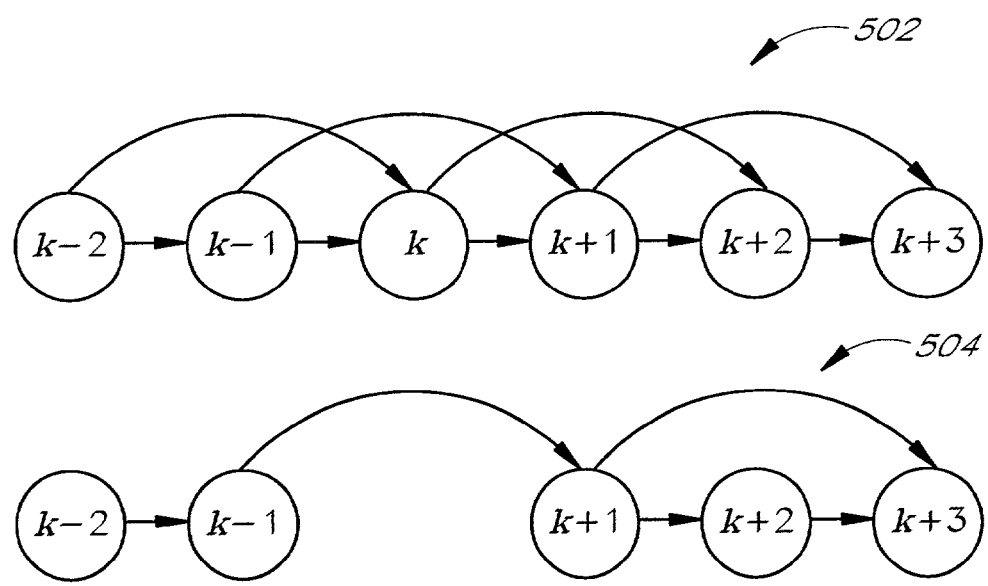
FIG. 5 illustrates an example use of second order motion compensation.

Further, Second-order Motion Compensation (SMC) is optionally provided to enhance error resiliency. The SMC process is performed by the encoder module 106B and generates supplemental motion vectors so that each predicted frame can be predicted separately from two preceding frames. Sequence 502 of FIG. 5 illustrates the SMC process, in which $k_{th}$ frame has motion vectors from both from the $(k-1)_{th}$ frame and the $(k-2)_{th}$ frame. Therefore, even if the motion vectors from the $(k-1)_{th}$ frame are corrupted, or the $(k-1)_{th}$ frame is itself corrupted, the $k_{th}$ frame can still be predicted from the $(k-2)_{th}$ frame using the corresponding motion vectors. Thus, by inserting the redundant motion vectors, also termed second-order motion vectors, from the $(k-2)_{th}$ frame to $k_{th}$ frame, the scene image quality at the decoder-side will be better protected from transmission errors. For example, even if all the information for $k_{th}$ frame is corrupted during transmission, the use of SMC can effectively suppress error propagation by excluding $k_{th}$ frame from being used in any later prediction as illustrated in FIG. 5 by sequence 504.

To perform SMC, a frame buffer is included in the encoder module 106B to store the previously decoded frame at time (t−2). This previously decoded frame is used to calculate the second order motion vectors. In one embodiment, these redundant motion vectors are not used in the encoder to produce residuals. The decoder uses the second order motion vectors when the bitstream is corrupted during the transmission and the first order motion vectors or corresponding frame is corrupted. Otherwise, the second order motion vectors need not be used in the decoder. Optionally, full, unrestricted motion search can be performed in order to determine these second-order motion vectors. The information regarding motion between frames (t−2) and (t−1) and between frames (t−1) and (t) can be combined in order to estimate these second-order motion vectors. For this reason, the SMC data can optionally be included, via the "user data mechanism", as explained below, for the first P-VOP following a scene change or for each P-VOP. The advantage of having SMC on only the first P-VOP is that bandwidth is not wasted when there is no error, thereby providing better coding efficiency. However, providing SMC for every P-VOP or for many P-VOPs enhances the robustness and decoding ability of the decoder, especially for cases of severe error conditions.

Figure 6:
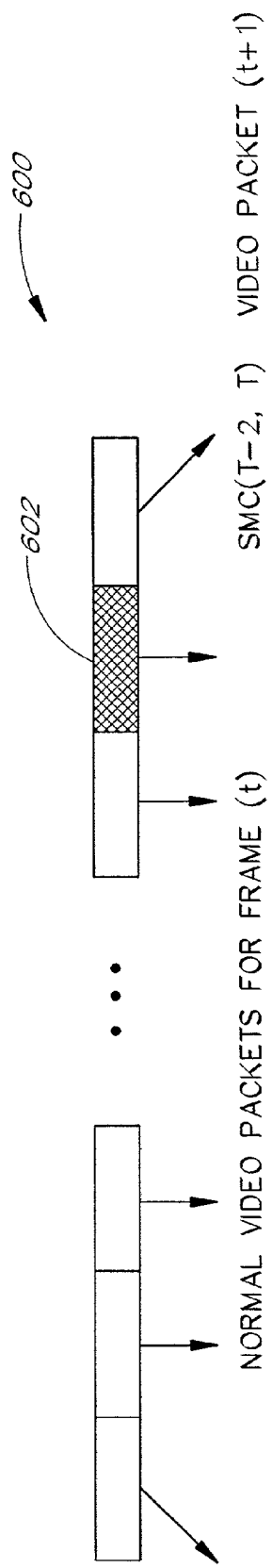
FIG. 6 illustrates an example packetized bitstream.

An additional video packet, referred to as "User data" or an "SMC" video packet, for each P-VOP is used to transmit these second-order motion vectors. This packet contains, in the same predictive fashion and using the same variable-length codes as in the standard motion vectors, a motion vector for each macroblock or selected macroblocks of the current P-VOP. An HEC is included in this special SMC video packet, which allows the SMC video packet to be decoded even if other packets for this P-VOP are lost. In one embodiment, this packet is positioned in the bitstream at the end of each P-VOP. A user can enable or disable the use of SMC by setting to 1 or 0 the corresponding option in the encoder parameter file. FIG. 6 illustrates an example packetized bitstream showing the relative position of packets in the bitstream, including the SMC packet 602.

Optionally, in order to make SMC packets compliant with the MPEG-4 syntax, a so-called "User data start code" (hex code B2) or the like, including other unique identifier codes to be assigned in the future by MPEG-standards committee and the like, precedes the HEC and motion vector information. The user data start code signals standard decoders not capable of using the second order motion vectors to ignore all bits following it until the next start code in the bitstream, which in this will be a VOP start code. In one embodiment, the encoder includes a unique 16-bit identifier in order not to confuse the SMC user data extensions with data that other people may decide to include in the bitstream following the same convention.

Figure 7:
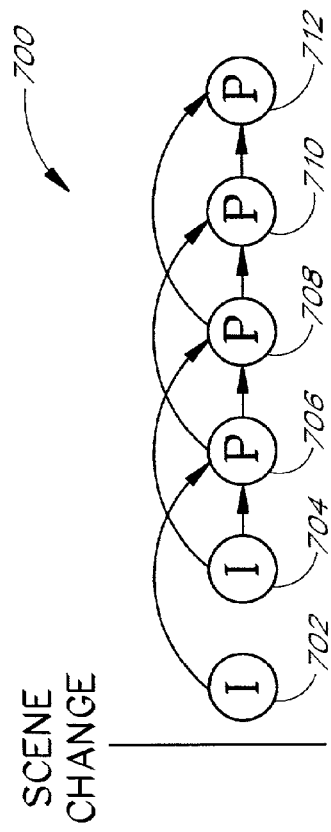
FIG. 7 illustrates an example use of consecutive I-frames in accordance with an embodiment of the present invention

To further enhance error resiliency, two consecutive I-frames are inserted upon a scene change, even if the second of the two frames is not a scene change frame and has low enough relative motion that it would normally be interceded, as illustrated in FIG. 7. That is, the scene change frame 702 is intracoded, and the next frame 704 is then automatically intracoded. Thus, the loss of one I-frame will not prevent the decoder from decoding the predicted frames 706, 706, 710, 712 that are predicted from frame 702 as well as frame 704. Frames subsequent to the second I-frame may be encoded as intracoded frames, such as P-frames or B-frames.

The use of two consecutive I-frames advantageously prevents the prediction of a frame in the current scene using scene content from other scenes, without degrading the performance of the SMC. Because the first two consecutive frames in a scene are intracoded, neither first nor second-order motion vectors are inserted into the I-frames.

The inclusion of the consecutive I-frames can be under the control of the preprocessing module 102B which can designate both a scene change frame and the next frame as intracoded frames. Alternatively, the encoder module 106B can automatically intracode a frame following a frame designated as an intracoded frame by the preprocessing module 102B.

While the insertion of two consecutive I-frames increases the bit-budget and thus decreases coding efficiency for a certain transmission bit-rate, in error-prone environments this inefficiency is more then compensated for by the additional error-resilience thereby provided. A "consecutive I-frame" flag is provided in the encoder parameter file that can be independent of the SMC flag. Advantageously, the presence of two consecutive I-frames at the beginning of each scene can be used for the decoder to conceal transmission errors more efficiently, even if the SMC mode is not turned on, or when it is turned on for just the first P-VOP following the (double) I-frame after a scene change.

Adaptive Intra Refresh (AIR) is optionally supported by the encoder module 106B as a by-product of SMC. This mode, enabled when selecting SMC for just the first P-VOP or for every P-VOP, encodes in INTRA mode those macroblocks that have as prediction macroblocks from frames (t−1) and (t−2) two significantly different macroblocks, as measured by the MAD distance measure. An example threshold is 20. Thus, if the MAD between the two prediction macroblocks for a given macroblock in the current frame is greater than 20, this macroblock is intracoded.

The encoder module 106B also performs general encoder functions, such as motion estimation, residual calculation, and the like. The encoder output can be stored for later transmission or can be transmitted in substantially real-time to a receiving terminal, such as a cellular phone, containing an appropriate decoder.

To increase error resilience, in one embodiment Intra__dc__vlc__thr is set to "0", so that all DC coefficients are coded using DC VLC in a frame or VOP. In addition, the ac_pred_flag may be disabled for all Intra macroblocks.

Both these options are permitted by the syntax and so are supported by standard decoders, and can result in higher quality for the case of error in transmission. This improvement can be on the order of 0.1–0.2 dB in PSNR. In particular, when data partitioning is enabled, the DC coefficient of each 8×8 DCT block of an INTRA macroblock can either be coded together with the 63 AC DCT coefficients, using what is known as an "INTER VLC" table, or separately, using what is known as an "INTRA VLC" table.

Using the INTRA VLC table results in separating the corresponding bits for the DC coefficient from those of the rest 63 AC coefficients as follows:

For an I-VOP, where the macroblocks are all intracoded, the DC data bits are located before the DC marker (DCM), together with the header bits, while the data bits for AC coefficients are placed after the DC marker.

For a P-VOP, the DC data bits are placed immediately after the Motion Marker (MM), together with other crucial or important information, and the data bits for AC coefficients follow.

This separation of DC and AC information enhances error resilience, since the DC data can be decoded and trusted even for corrupted packets, if the DCM/MM markers are correctly hitting during the decode process. Further, with respect to P-VOPs, Reversible Variable Length Code (RVLC) forward/backward decoding can reveal at least one good first part.

To control whether the DC data is coded together or separate from AC coefficients, the flag called "intra_dc_vlc_thr" is used for each VOP that maps, according to the QP value, each macroblock. Setting this value=0 means that all macroblocks, regardless of their QP should use an INTRA DC table and thus separate DC data from AC coefficients. This is a standard syntactic element in MPEG-4 and thus supported by standard decoders.

The ac_pred_flag is another option that indicates whether for a specific block of an INTRA macroblock, the top row and first column DCT coefficients, are coded independently or differentially with respect to the neighboring blocks. To enhance error resilience it is preferable to set ac_pred_flag to 0.

In one embodiment, error-correction is supported at the source level by using Forward Error Correction (FEC). In particular, Bose-Chaudhuri-Hocquenghem (BCH) codes, including Reed-Solomon, are supported. As is well known in the art, BCH is an error detection and correction technique based on Cyclic Redundancy Code. For any positive integers m, m>3, and $t<2^{m-1}$, there is a binary BCH code with a block length n equal to $2^m-1$ and n–k<mt parity check bits, where k is the number of information bits. The BCH code has a minimum distance of at least 2t+1. Each binary BCH code (n, k, t) can correct up to t bit errors, and thus it is also referred to as a t-error-correcting code.

Different block sizes may be used. In one embodiment, a block size of 511 is used. FEC is performed at a packetizer level of the elementary video bitstream, which can be considered as source-level error correction. By contrast, channel level error-correction introduces redundancy at the bit-level after multiplexing.

Figure 11:
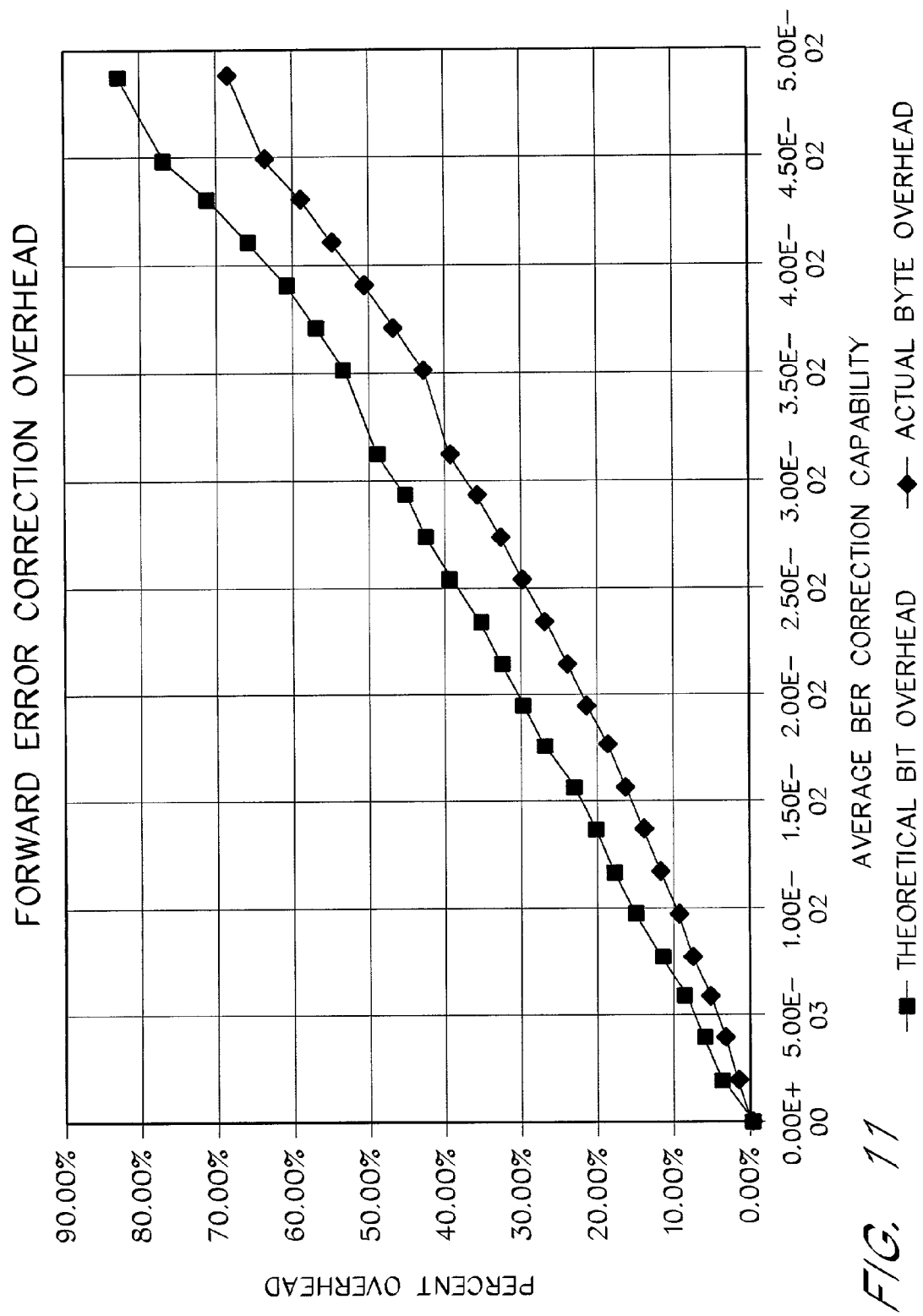
FIG. 11 illustrates an example graph of Forward Error Correction overhead vs. average BER correction capability.

FEC can provide significant error resilience, at the cost of some bit budget. FIG. 11 illustrates an example graph of Forward Error Correction overhead vs. average BER correction capability. As illustrated, there is a close relation between FEC redundancy and error correcting capability, which is a strong indicator of error resilience. Preferably, at least double the expected BER is provided for.

In one embodiment of the present invention, rather then apply FEC to all packet data, a more efficient process is performed that reduces the number of error correction bits generated as compared to conventional approaches, while still providing significant error correcting capability. One embodiment of the FEC process optionally generates FEC bits only for selected portions of the packets, and in particular, for those portions that are considered more essential or important for purposes of reproducing a frame sequence by the decoder. In addition, the FEC process provides a systematic code, that is, the FEC correction or parity bits are separate from the original uncoded data bits. Thus, even if all the FEC bits are lost, the original selected portions of the packet are still potentially decodable. Further, in one embodiment the FEC data is encoded and transmitted in an MPEG-4 compliant manner as explained below. Thus, even if a decoder that is not equipped to process the FEC data receives the FEC packet, the decoder will still be able to process the frame motion and texture data.

In particular, FEC is efficiently applied to important data, such as motion vectors, DC coefficients and header information, and FEC bits are not generated for unimportant or less important data. This more important data may be located in a packet between a packet resync field and a motion marker. In particular, for a given frame or VOP, the selected bits targeted for FEC coding are concatenated together with those from other frame packets and the FEC code bits are generated for the concatenated bits.

In one embodiment, rather than including the FEC bits in the same packet or packets as the frame data, for a given frame or VOP, the resulting FEC bits are placed in an additional packet after the regular frame or VOP packets to ensure MPEG compatibility.

In addition, to better allow the decoder to recover in cases were a data packet is lost or has a motion marker missing, for each standard packet, in the FEC packet a packet identifier is stored in association with a corresponding value indicating how many bits and/or which bits where used to generate FEC bits.

In order to maintain compatibility with reference or conventional MPEG-4 decoders, this additional FEC packet further includes a user data identifier code, "user_data_start_code," used to identify user defined data, and as such will be ignored by conventional decoders not equipped to process the FEC packet. In addition, where there is no error, the FEC packet will not be used by decoders equipped to handle the FEC bits. But when errors do occur, FEC decoding will help recover data that will allow for decoding even under severe error conditions.

Thus, as described above, by providing error resiliency and enhanced compression, embodiments of the present invention advantageously enable the transmission of video information even in low-bit rate, high noise environments. For example, embodiments of the present invention enable video transmission to be successfully performed over cellular networks and the like.

Although this invention has been described in terms of certain preferred embodiments, other embodiments that are apparent to those of ordinary skill in the art are also within the scope of this invention.

APPENDIX A

Incorporation by Reference of Commonly Owned Applications

The following patent applications, commonly owned and filed on the same day as the present application, are hereby incorporated herein in their entirety by reference thereto:

| Title | Application No. | Attorney Docket No. |
|---|---|---|
| SYSTEMS AND METHODS FOR ENHANCED ERROR CONCEALMENT IN A VIDEO DECODER | 10/092,366 | INTV.005A |
| SYSTEMS AND METHODS FOR DECODING OF PARTIALLY CORRUPTED REVERSIBLE VARIABLE LENGTH CODE (RVLC) INTRA-CODED MACROBLOCKS AND PARTIAL BLOCK DECODING OF CORRUPTED MACROBLOCKS IN A VIDEO DECODER | 10/092,376 | INTV.006A |
| SYSTEMS AND METHODS FOR DECODING OF SYSTEMATIC FORWARD ERROR CORRECTION (FEC) CODES OF SELECTED DATA IN A VIDEO BITSTREAM | 10/092,353 | INTV.007A |
| SYSTEMS AND METHODS FOR MANAGEMENT OF DATA IN A RING BUFFER FOR ERROR RESILIENT DECODING OF A VIDEO BITSTREAM | 10/092,384 | INTV.008A |
| SYSTEMS AND METHODS FOR REFRESHING MACROBLOCKS | 10/092,375 | INTV.010A |
| SYSTEMS AND METHODS FOR REDUCING FRAME RATES IN A VIDEO DATA STREAM | 10/092,345 | INTV.011A |
| SYSTEMS AND METHODS FOR PERFORMING GENERATING ERROR CORRECTION INFORMATION FOR A MEDIA STREAM | 10/092,392 | INTV.012A |
| SYSTEMS AND METHODS FOR PERFORMING BIT RATE ALLOCATION FOR A VIDEO DATA STREAM | 10/092,383 | INTV.013A |
| SYSTEMS AND METHODS FOR ENCODING REDUNDANT MOTION VECTORS IN COMPRESSED VIDEO BITSTREAMS | 10/092,373 | INTV.014A |
| SYSTEMS AND METHODS FOR DECODING REDUNDANT MOTION VECTORS IN COMPRESSED VIDEO BITSTREAMS | 10/092,339 | INTV.015A |
| SYSTEMS AND METHODS FOR DETECTING SCENE CHANGES IN A VIDEO DATA STREAM | 10/092,394 | INTV.016A |

What is claimed is:

1. A method of error resilient encoded video transmission, the method comprising the steps of:
receiving at an encoder a first frame and a next consecutive frame of a video data sequence;
determining if the first frame is indicative of a scene change in the video data sequence;
intracoding the first frame responsive to a positive determination that the first frame is indicative of a scene change;
intracoding the next consecutive frame responsive to the positive determination that the first frame is indicative of a scene change;
transmitting over a transmission medium the intracoded first frame and the intracoded next consecutive frame; and
decoding at a decoder any of the first frame and the next consecutive frame that traverses the transmission medium without unrecoverable degradation to reconstruct the video data sequence.

2. The method as recited in claim 1, whereby the transmission of the intracoded first frame and the intracoded next consecutive frame in the transmitting step is MPEG-4 compliant.

3. The method as recited in claim 1, wherein the first frame is an MPEG compliant I-frame.

4. The method as recited in claim 1, wherein the next consecutive frame is an MPEG compliant I-frame.

5. The method as recited in claim 1, wherein the next consecutive frame is not a scene change frame.

6. The method as recited in claim 1, further including the steps of:
receiving at the encoder a frame in the video data sequence immediately subsequent to the next consecutive frame;
intercoding the frame immediately subsequent to the next consecutive frame;
transmitting the intercoded frame immediately subsequent to the next consecutive frame in the transmitting step; and
decoding the intercoded frame immediately subsequent to the next consecutive frame in the decoding step.

7. The method as recited in claim 1, wherein the scene change determination step includes the step of reading from a file the indication that the first frame corresponds to a scene change.

8. A video coding apparatus, comprising:
a processor;
a first instruction sequence stored in a processor readable memory, the first instruction sequence operable to cause the processor to receive an indication that a first frame in a video data sequence is to be intracoded;
a second instruction sequence stored in the processor readable memory, the second instruction sequence operable to cause the processor to intracode the first frame responsive to the indication; and
a third instruction sequence stored in the processor readable memory, the third instruction sequence operable to cause the processor to intracode the frame in the video data sequence immediately after the first frame responsive to the indication that the first frame is to be intracoded, the frame immediately after the first frame being intracoded such that any of the first frame and the frame immediately after the first frame is used to reconstruct the video data sequence.

9. The video coding apparatus as recited in claim 8, wherein the video coding apparatus is an integrated circuit.

10. The video coding apparatus as recited in claim 8, wherein the video coding apparatus is a cellular phone.

11. The video coding apparatus as recited in claim 8, wherein the video coding apparatus is a desktop computer.

12. The video coding apparatus as recited in claim 8, wherein the video coding apparatus is a personal digital assistant.

13. The video coding apparatus as recited in claim 8, further including a fourth instruction sequence stored in a processor readable memory, the fourth instruction sequence operable to cause the processor to determine if the first frame is a scene change frame and further operable to cause the processor to provide the indication that the first frame is to be intracoded upon a positive determination that the first frame is a scene change frame.

14. The video coding apparatus as recited in claim 8, further comprising a file having stored therein the indication tat the first frame is to be intracoded.

15. A method of encoding video frames, the method comprising:
receiving a video data sequence:
receiving a first instruction to intracode a first frame in the video data sequence;
intracoding the first frame in the video data sequence responsive to the first instruction; and
intracoding a second frame in the video data sequence responsive to the first instruction to intracode the first frame, the second frame being immediately subsequent to the first frame, the second frame being intracoded such that any of the first frame and the second frame is used to reconstruct the video data sequence.

16. The method as recited in claim 15, further comprising transmitting the intracoded first frame and the intracoded second frame.

17. The method as recited in claim 15, wherein the first instruction is executed only if the first frame is a scene change frame.

18. The method as recited in claim 15, whereby the second frame is intracoded in the second frame intracoding step where data of the second frame is of an activity level that would indicate the second frame to be interceded in the absence of the first instruction.

19. The method as recited in claim 15, further comprising intercoding a third frame in accordance with relative visual motion of elements displayed thereby, the third frame being immediately subsequent to the second frame.

20. An encoding apparatus, comprising:
means for receiving a video data sequence;
means for receiving a first instruction to intracode a first frame in the video data sequence;
means for intracoding the first frame responsive to the first instruction; and
means for intracoding a second frame in the video data sequence responsive to the first instruction to intracode the first frame, the second frame being immediately subsequent to the first frame, the second frame being intracoded such that any of the first frame and the second frame is used to reconstruct the video data sequence.

21. The encoding apparatus as recited in claim 20, further comprising means for retrieving the first intracoded frame and the second intracoded frame from the video data sequence.

22. The encoding apparatus as recited in claim 20, wherein the encoding apparatus is included in an integrated circuit.

* * * * *